(12) United States Patent
Wong et al.

(10) Patent No.: US 11,626,505 B2
(45) Date of Patent: Apr. 11, 2023

(54) DIELECTRIC INNER SPACERS IN MULTI-GATE FIELD-EFFECT TRANSISTORS

(71) Applicant: Taiwan Semiconductor Manufacturing Co., Ltd., Hsin-Chu (TW)

(72) Inventors: I-Hsieh Wong, Hsinchu (TW); Wei-Yang Lee, Taipei (TW); Feng-Cheng Yang, Hsinchu County (TW); Yen-Ming Chen, Hsin-Chu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/847,321

(22) Filed: Apr. 13, 2020

(65) Prior Publication Data

US 2020/0411667 A1 Dec. 31, 2020

Related U.S. Application Data

(60) Provisional application No. 62/867,545, filed on Jun. 27, 2019.

(51) Int. Cl.
*H01L 29/66* (2006.01)
*H01L 29/06* (2006.01)
(Continued)

(52) U.S. Cl.
CPC ...... *H01L 29/66545* (2013.01); *H01L 21/022* (2013.01); *H01L 21/02293* (2013.01); *H01L 29/0649* (2013.01); *H01L 29/511* (2013.01); *H01L 29/66553* (2013.01); *H01L 29/66636* (2013.01); *H01L 29/66795* (2013.01)

(58) Field of Classification Search
CPC ............ H01L 29/66795; H01L 29/785; H01L 29/66553; H01L 29/66545
See application file for complete search history.

(56) References Cited

U.S. PATENT DOCUMENTS

| 2016/0148930 A1* | 5/2016 | Shin .................... H01L 29/1095 257/192 |
| 2016/0233334 A1* | 8/2016 | Shin .................... H01L 29/7839 |

(Continued)

OTHER PUBLICATIONS

Kim et al. "Characterization of low-dielectric constant SiOC thin films deposited by PECVD for interlayer dielectrics of multilevel interconnection" in Surface and Coatings Technology vol. 171, pp. 39-45. Published by Elsevier Science in 2003 (Year: 2003).*

*Primary Examiner* — Tuan A Hoang
(74) *Attorney, Agent, or Firm* — Haynes and Boone, LLP

(57) ABSTRACT

A semiconductor structure and a method of fabricating thereof is provided. The semiconductor structure may include a plurality of channel layers disposed over a semiconductor substrate, a plurality of metal gate (MGs) each disposed between two channel layers, an inner spacer disposed on a sidewall of each MG, a source/drain (S/D) feature disposed adjacent to the plurality of MGs, and a low-k dielectric feature disposed on the inner spacer, where the low-k dielectric feature extends into the S/D feature. The low-k dielectric feature may include two dissimilar dielectric layers, one of which may be air.

20 Claims, 20 Drawing Sheets

(51) Int. Cl.
 *H01L 21/02* (2006.01)
 *H01L 29/51* (2006.01)

(56) References Cited

U.S. PATENT DOCUMENTS

| | | | |
|---|---|---|---|
| 2017/0110554 A1* | 4/2017 | Tak | H01L 29/42392 |
| 2017/0250261 A1* | 8/2017 | Kim | H01L 29/0673 |
| 2018/0315828 A1* | 11/2018 | Yamashita | H01L 29/66545 |
| 2018/0358435 A1* | 12/2018 | Mochizuki | H01L 29/0673 |
| 2020/0135922 A1* | 4/2020 | Chen | H01L 29/66795 |

\* cited by examiner

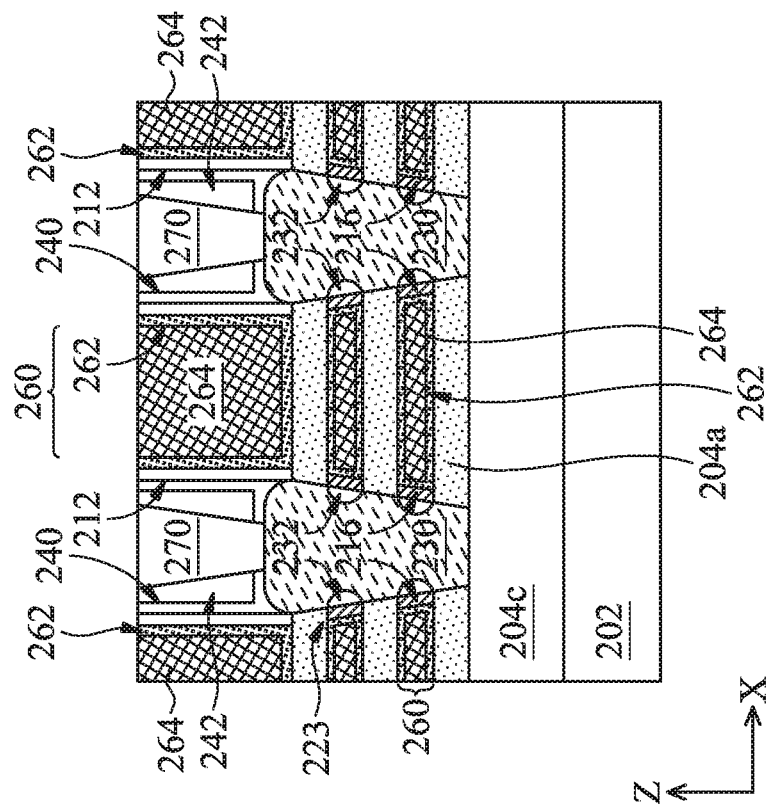
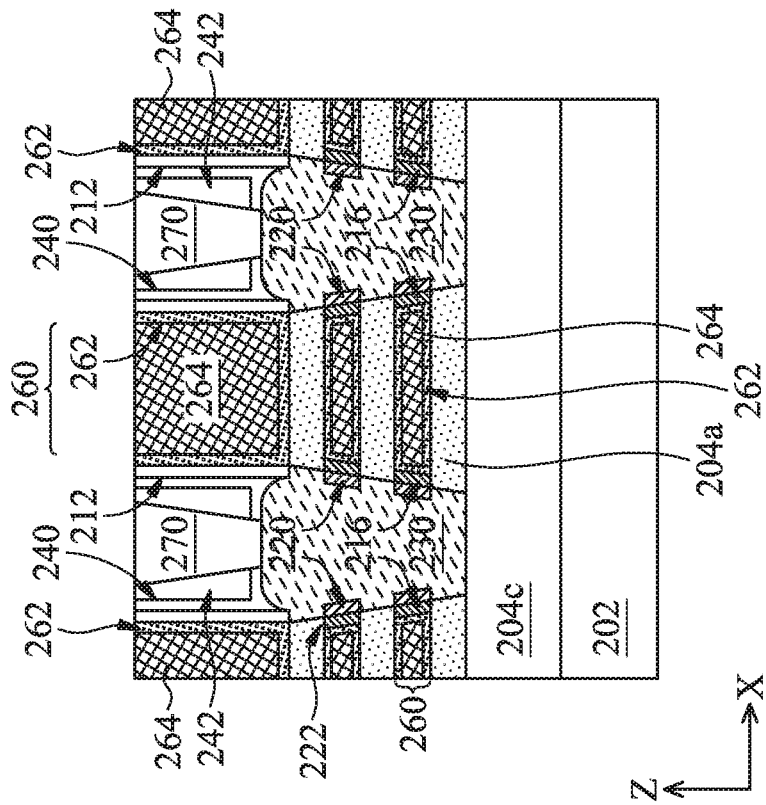

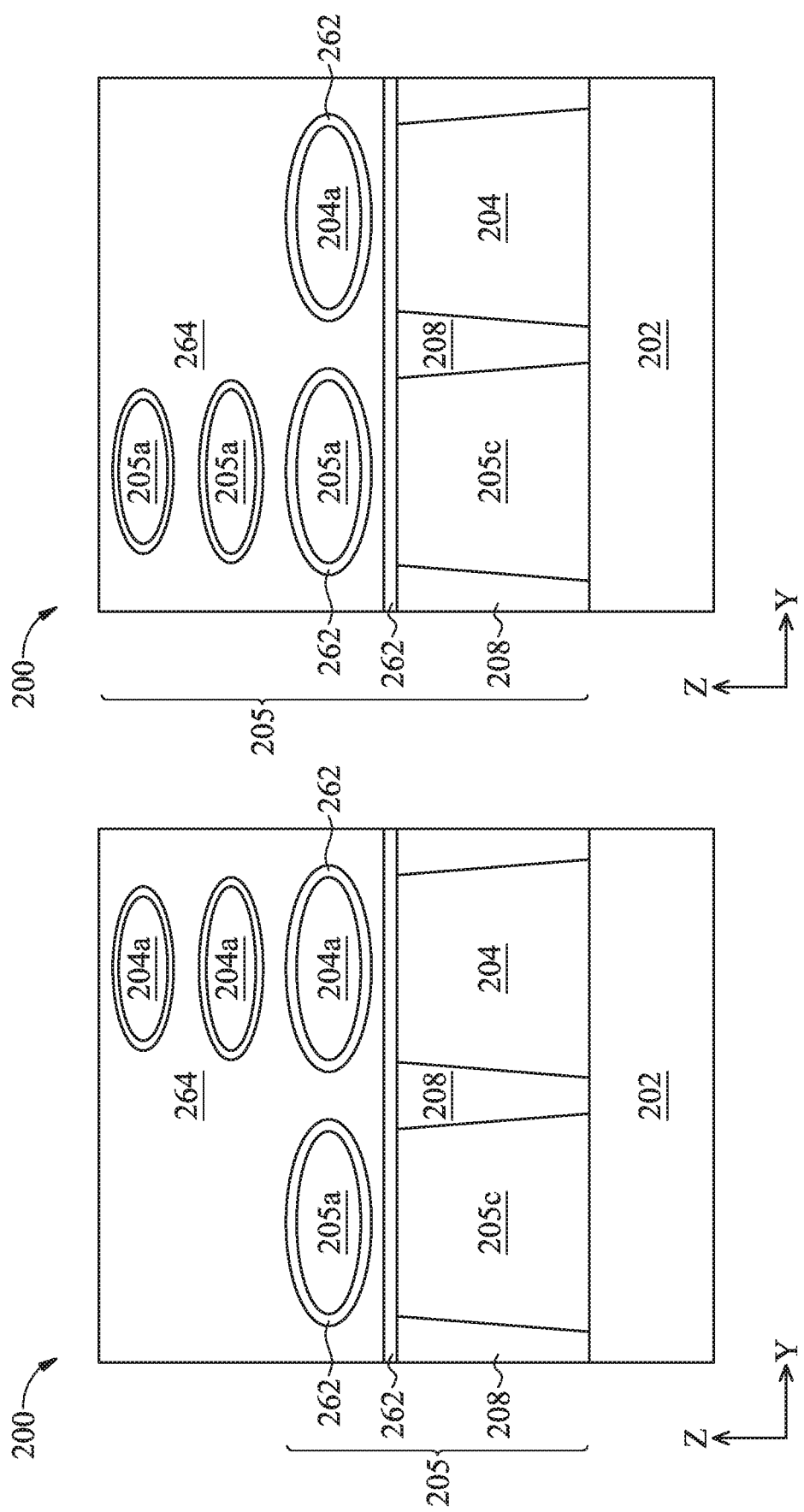

DIELECTRIC INNER SPACERS IN MULTI-GATE FIELD-EFFECT TRANSISTORS

CROSS-REFERENCE TO RELATED APPLICATIONS

This is a non-provisional application of and claims priority to U.S. Provisional Patent Application Ser. No. 62/867,545, filed on Jun. 27, 2019, the entire disclosure of which is incorporated herein by reference.

BACKGROUND

The semiconductor industry has experienced rapid growth. Technological advances in semiconductor materials and design have produced generations of semiconductor devices where each generation has smaller and more complex circuits than the previous generation. In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. But these advances have also increased the complexity of processing and manufacturing semiconductor devices.

Multi-gate transistors, such as gate-all-around (GAA) transistors, have been incorporated into various memory and core devices to reduce IC chip footprint while maintaining reasonable processing margins. As with other semiconductor devices, scaling down has indeed increased the complexity of manufacturing GAA transistors and, in order for their advances to be realized, improvements in various aspects of their fabrication processes are needed. In one such example, providing inner spacers with sufficient etching resistance without increasing the overall parasitic capacitance and/or sacrificing effective channel length of a GAA transistor becomes more challenging when device sizes continue to decrease. Although existing methods of fabricating inner spacers have been generally adequate, they have not been entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3, 4, 5, 6, 7, 8, 9, 10, 11, 12, 13, 14, 15A, 15B, 16A, 16B, 16C, 16D, 16E, 16F, 16G, 16H, 17A, 17B, 18A, 18B, 19A, 19B, 20A, 20B, 21A, 21B, 22A, and 22B are cross-sectional views of the semiconductor device taken along line AA' as shown in FIGS. 2A and/or 2B, in portion or in entirety, during intermediate stages of the method shown in FIGS. 1A and/or 1B according to various embodiments of the present disclosure.

FIGS. 23A, 23B, and 24 are cross-sectional views of the semiconductor device taken along line BB' as shown in FIGS. 2A and/or 2B, in portion or in entirety, during intermediate stages of the method shown in FIGS. 1A and/or 1B according to various embodiments of the present disclosure.

DETAILED DESCRIPTION

Figure 1A:
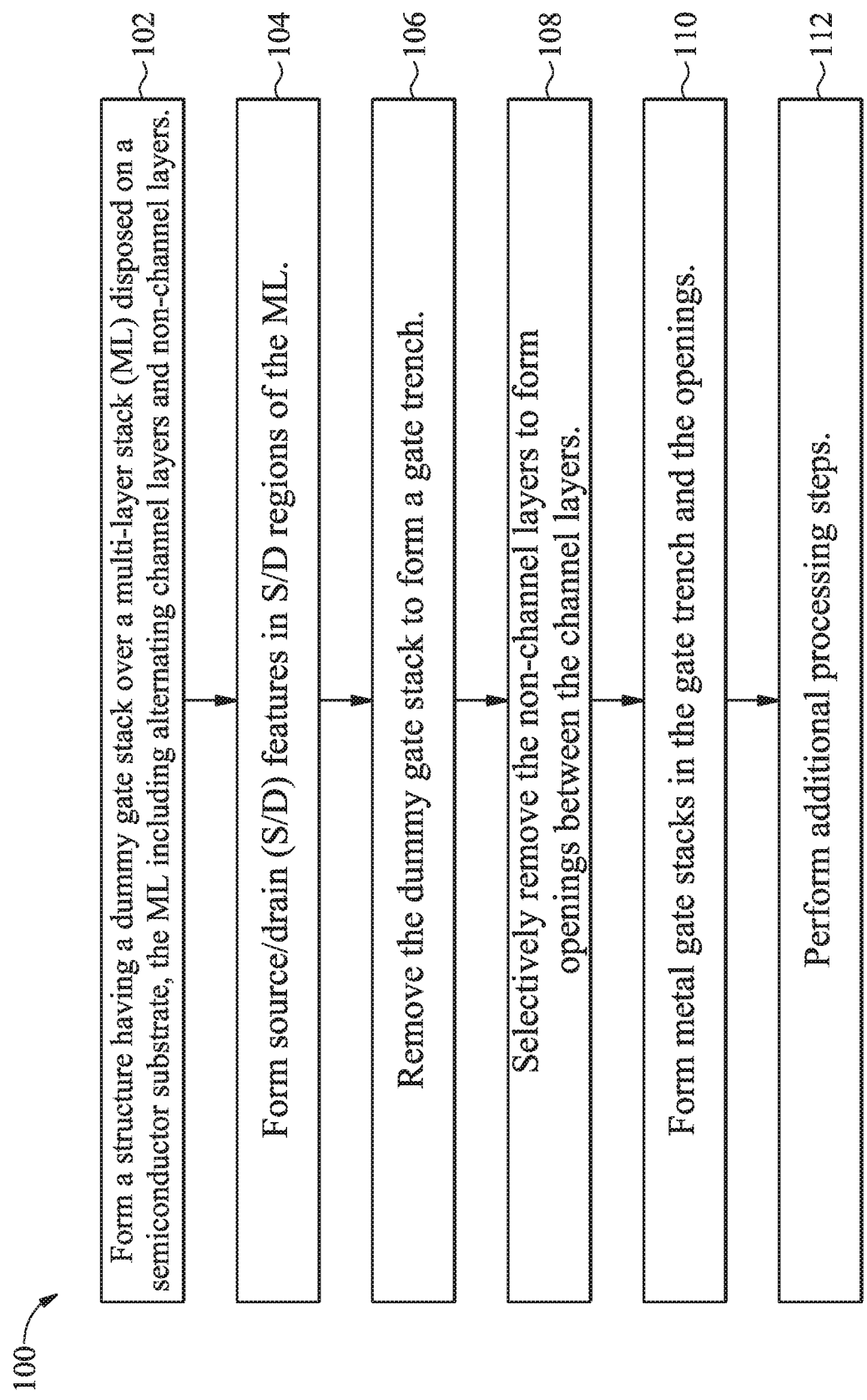
FIGS. 1A and 1B illustrate a flowchart of an example method for fabricating a semiconductor device according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to field-effect transistors (FETs), such as three-dimensional multi-gate (e.g., gate-all-around (GAA)) FETs, fin FETs (FinFETs), and/or other FETs. Generally, a GAA FET includes a plurality of vertically stacked sheets (e.g., nanosheets), wires (e.g., nanowires), or rods (e.g., nanorods) in a channel region of the FET, thereby allowing better gate control, lowered leakage current, and improved scaling capability for various IC applications. While existing technologies for fabricating GAA FETs have been generally adequate for their intended applications, they have not been entirely satisfactory in all aspects. The present disclosure includes multiple embodiments. Different embodiments may have different advantages, and no particular advantage is necessarily required of any embodiment.

Figure 1B:
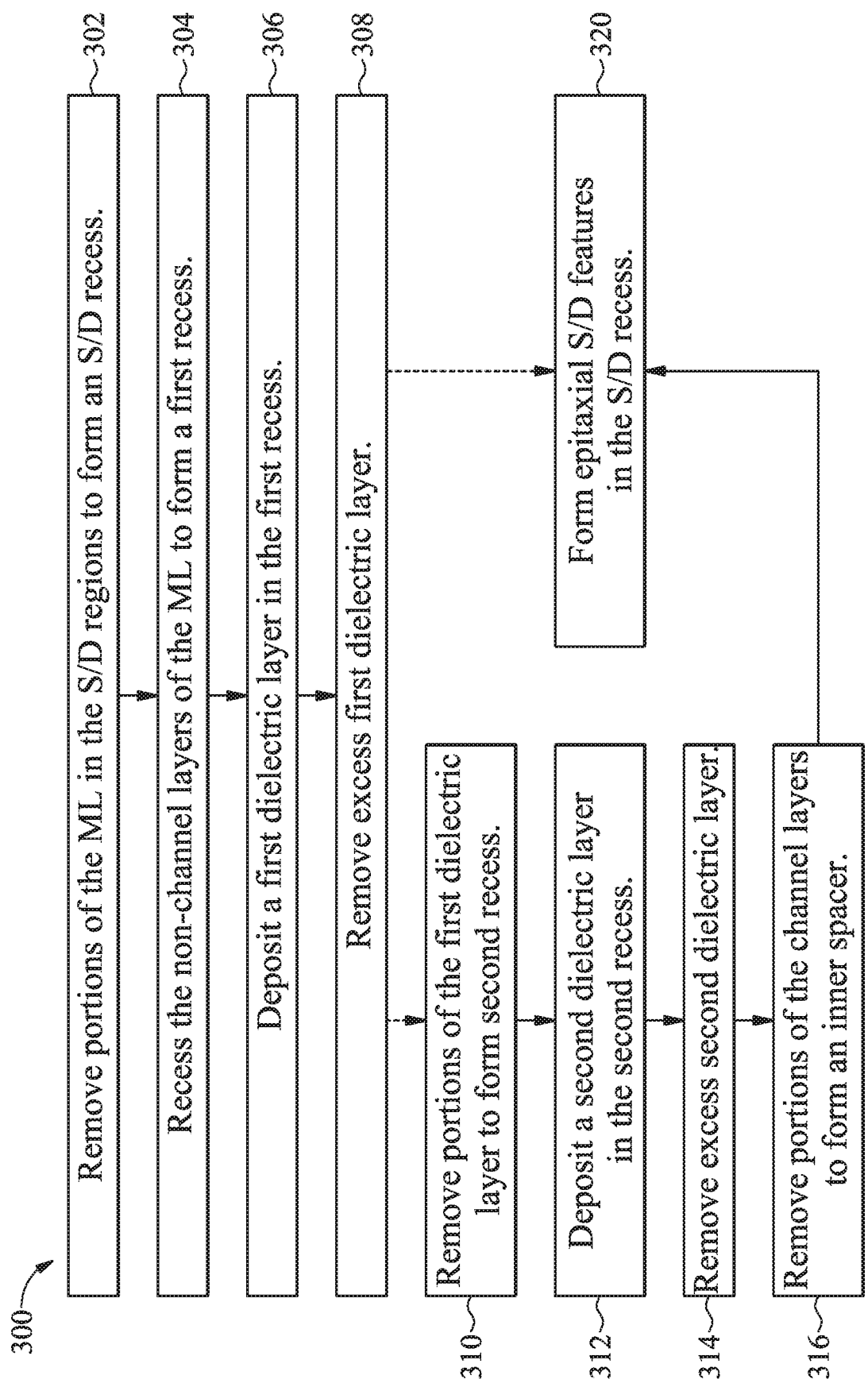

Referring now to FIGS. 1A and 1B, flowcharts of a method 100 and a method 300 of forming a semiconductor device 200 (hereafter simply referred to as the device 200) are illustrated according to various aspects of the present disclosure. Methods 100 and 300 are merely examples and are not intended to limit the present disclosure beyond what is explicitly recited in the claims. Additional operations can be provided before, during, and after methods 100 and 300, and some operations described can be replaced, eliminated, or moved around for additional embodiments of the method. Methods 100 and 300 are described below in conjunction with FIGS. 2A-22B, which are cross-sectional views of the device 200 taken along the dashed line AA' shown in FIGS. 2A and 2B at intermediate steps of methods 100 and/or 300. The device 200 may be an intermediate device fabricated during processing of an IC, or a portion thereof, that may comprise static random-access memory (SRAM) and/or other logic circuits, passive components such as resistors, capacitors, and inductors, and active components such as GAA FETs, FinFETs, metal-oxide semiconductor field effect transistors (MOSFETs), complementary metal-oxide semiconductor (CMOS) transistors, bipolar transistors, high voltage transistors, high frequency transistors, and/or other transistors. The present disclosure is not limited to any particular number of devices or device regions, or to any particular device configurations. For example, though the device 200 as illustrated is a three-dimensional device, the present disclosure may also provide embodiments for fabricating planar devices. Additional features can be added to the device 200, and some of the features described below can be replaced, modified, or eliminated in other embodiments of the device 200.

At operation 102, referring to FIGS. 1A and 2A-4, method 100 forms the device 200 that includes one or more fins (or active regions) 204 protruding from a substrate 202 and separated by isolation structures 208, a dummy gate stack 210 disposed over the fins 204, and top spacers 212 disposed on sidewalls of the dummy gate stack 210. Though not depicted, the device 200 may include other components, such as hard mask layers, barrier layers, other suitable layers, or combinations thereof, disposed over the dummy gate stack 210.

The substrate 202 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions are disposed in or on the substrate 202. The doped regions may be doped with n-type dopants, such as phosphorus or arsenic, and/or p-type dopants, such as boron or $BF_2$, depending on design requirements. The doped regions may be formed directly on the substrate 202, in a p-well structure, in an n-well structure, in a dual-well structure, or in a raised structure. Doped regions may be formed by implantation of dopant atoms, in-situ doped epitaxial growth, and/or other suitable techniques. Each fin 204 may be suitable for providing an n-type FET or a p-type FET. In some embodiments, the fins 204 as illustrated herein may be suitable for providing FETs of a similar type, i.e., both n-type or both p-type. Alternatively, they may be suitable for providing FETs of different types, i.e., an n-type and a p-type. This configuration is for illustrative purposes only and is not intended to be limiting.

In the present embodiments, each fin 204 includes a base fin 204c protruding from the substrate 202 and a stack of alternating layers 204a and 204b (collectively referred to as the "multi-layer stack" or ML) disposed over the base fin 204c. The base fins 204c may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the base fins 204c on the substrate 202. The etching process may include dry etching, wet etching, reactive ion etching (RIE), and/or other suitable processes.

Numerous other embodiments of methods for forming the base fins 204c may be suitable. For example, the base fins 204c may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the base fins 204c.

Figure 3:
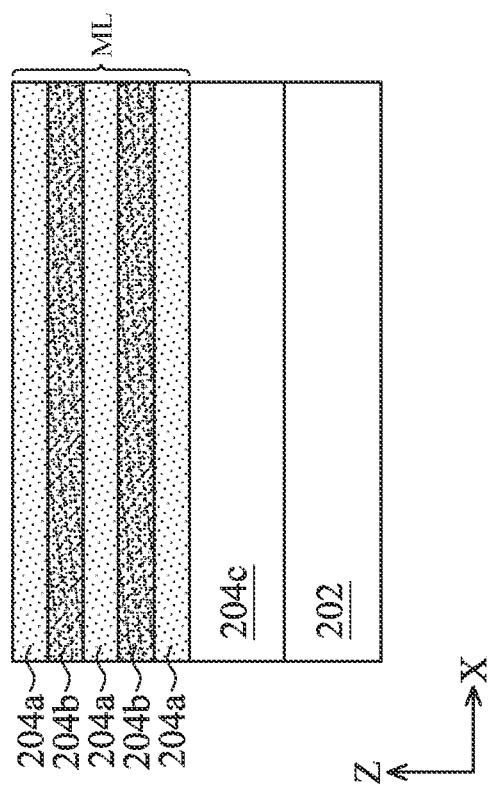

In the present embodiments, referring to the ML depicted in FIG. 3, each layer 204a includes a semiconductor material such as, for example, Si, Ge, SiC, SiGe, GeSn, SiGeSn, SiGeCSn, and/or other suitable semiconductor materials, while each layer 204b is a sacrificial layer configured to be removed at a subsequent processing step discussed in detail below. In some embodiments, the layer 204b includes a semiconductor material different from the semiconductor material of the layer 204a. In one such example, the layer 204a may include elemental Si and the layer 204b may include SiGe. In another example, the layer 204a may include elemental Si, while the layer 204b may include elemental Ge. In some embodiments, the layer 204b includes a dielectric material such as, for example, silicon oxide, silicon nitride, silicon oxynitride, and/or other suitable dielectric material. In some examples, the fin 204 may include a total of three to ten pairs of alternating layers 204a and 204b; of course, other configurations may also be applicable depending upon specific design requirements. In some examples, the semiconductor layer 204a may be formed to a thickness $t_{ch}$ of about 2 nm to about 10 nm, and the sacrificial layer 204b may be formed to a thickness $t_s$ of about 5 nm. In some examples, a ratio of the thickness $t_s$ to the thickness $t_{ch}$ may be about 2:5 to about 2:1. The base fins 204c, the layers 204a, and/or the layers 204b may be doped with a suitable dopant, such as a p-type dopant or an n-type dopant discussed above, for forming desired FETs.

In the present embodiments, forming the ML includes alternatingly growing the layers 204a and 204b in a series of epitaxy processes. The epitaxy process may include chemical vapor deposition (CVD) techniques (for example, vapor-phase epitaxy (VPE), ultra-high vacuum CVD (UHV-CVD), low-pressure (LP-CVD), and/or plasma-enhanced CVD (PE-CVD)), molecular beam epitaxy, other suitable SEG processes, or combinations thereof. The epitaxy process may use gaseous and/or liquid precursors, which interact with the composition of the underlying substrate. In some examples, the layers 204a and 204b may be provided in the form of nanosheets, nanowires, or nanorods. A sheet (or wire) release process may then remove the layers 204b (e.g., the SiGe-containing layers) to form multiple openings between the layers 204a (e.g., the Si-containing layers), and high-k metal gate structures (HKMGs) are subsequently formed in the openings, thereby providing a GAA FET. For this reason, the layers 204a are hereafter referred to as channel layers 204a, and the layers 204b are hereafter referred to as non-channel layers 204b.

Multi-gate devices, such as GAA FETs, have been introduced to improve gate control by increasing gate-channel coupling, reduce OFF-state current, and reduce short-channel effects (SCEs). A GAA FET generally includes a gate structure that wraps around a plurality of horizontal semiconductor layers, thereby providing access to the channel region on all sides. The GAA FETs are generally compatible with CMOS processes, allowing them to be scaled down while maintaining gate control and mitigating SCEs. Of course, the present disclosure is not limited to forming GAA FETs only and may provide other three-dimensional FETs such as FinFETs. As such, the fin 204 may include a single layer of semiconductor material or multiple layers of different semiconductor materials not configured in an alternating stack, such that a uniform fin is provided to form a FinFET.

Because HKMGs are interleaved between channel layers in a GAA FET, inner gate spacers are provided between sidewalls of the HKMGs and portions of epitaxial source/drain (S/D) features disposed adjacent to the HKMGs to reduce parasitic capacitance of the device, which generally decreases with increasing thickness of the inner spacers. However, while the inner spacers generally offer the advantage of reducing capacitance and improving device reliability in GAA FETs, they have not been entirely satisfactory in all aspect. For example, increase in thickness of the inner spacers for purposes of reducing parasitic capacitance between the HKMGs and adjacent S/D features may reduce the effective channel length of the device and thus inducing adverse SCEs in the channel region of the device. The present disclosure provides methods of forming inner spacers to reduce parasitic capacitance in GAA FETs without substantially shortening the effective channel length of the devices caused by thicker inner spacers. Additionally, the present disclosure contemplates embodiments of inner spacers configured to withstand the etching process when removing the dummy gate stacks 210.

Referring back to FIG. 2A, the isolation structures 208 may include silicon oxide, silicon nitride, silicon oxynitride, fluoride-doped silicate glass (FSG), a low-k dielectric material, and/or other suitable materials. The isolation structures 208 may include shallow trench isolation (STI) features. In one embodiment, the isolation structures 208 are formed by etching trenches in the substrate 202 during the formation of the fins 204. The trenches may then be filled with an isolating material described above by a deposition process, followed by a chemical mechanical planarization (CMP) process. In another embodiment, the isolation structures 208 are formed by depositing a dielectric layer as a spacer layer over the fins 204 and subsequently recessing the dielectric layer such that a top surface of the isolation structures 208 is below a top surface of the fins 204. Other isolation structure such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers. The isolation structures 208 may be deposited by any suitable method, such as CVD, flowable CVD (FCVD), spin-on-glass (SOG), other suitable methods, or combinations thereof.

Figure 2B:
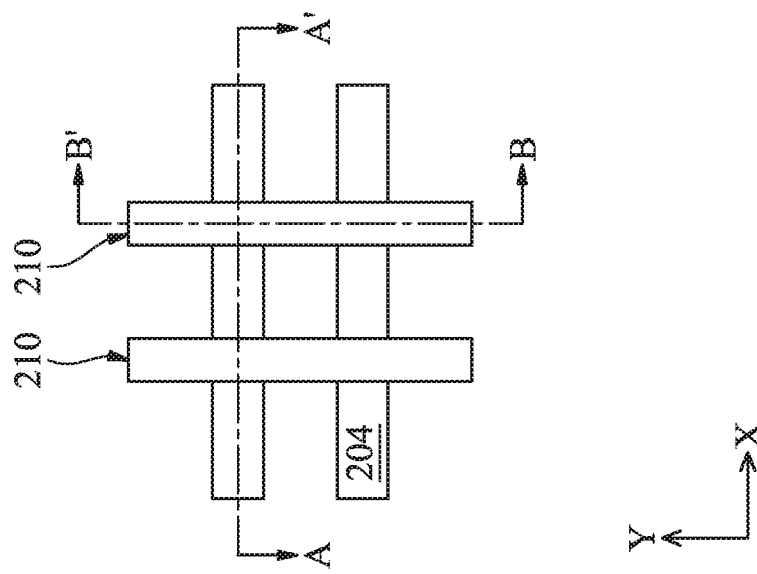
FIG. 2B is a planar top view of the semiconductor device shown in FIG. 2A according to various embodiments of the present disclosure.
Figure 2A:
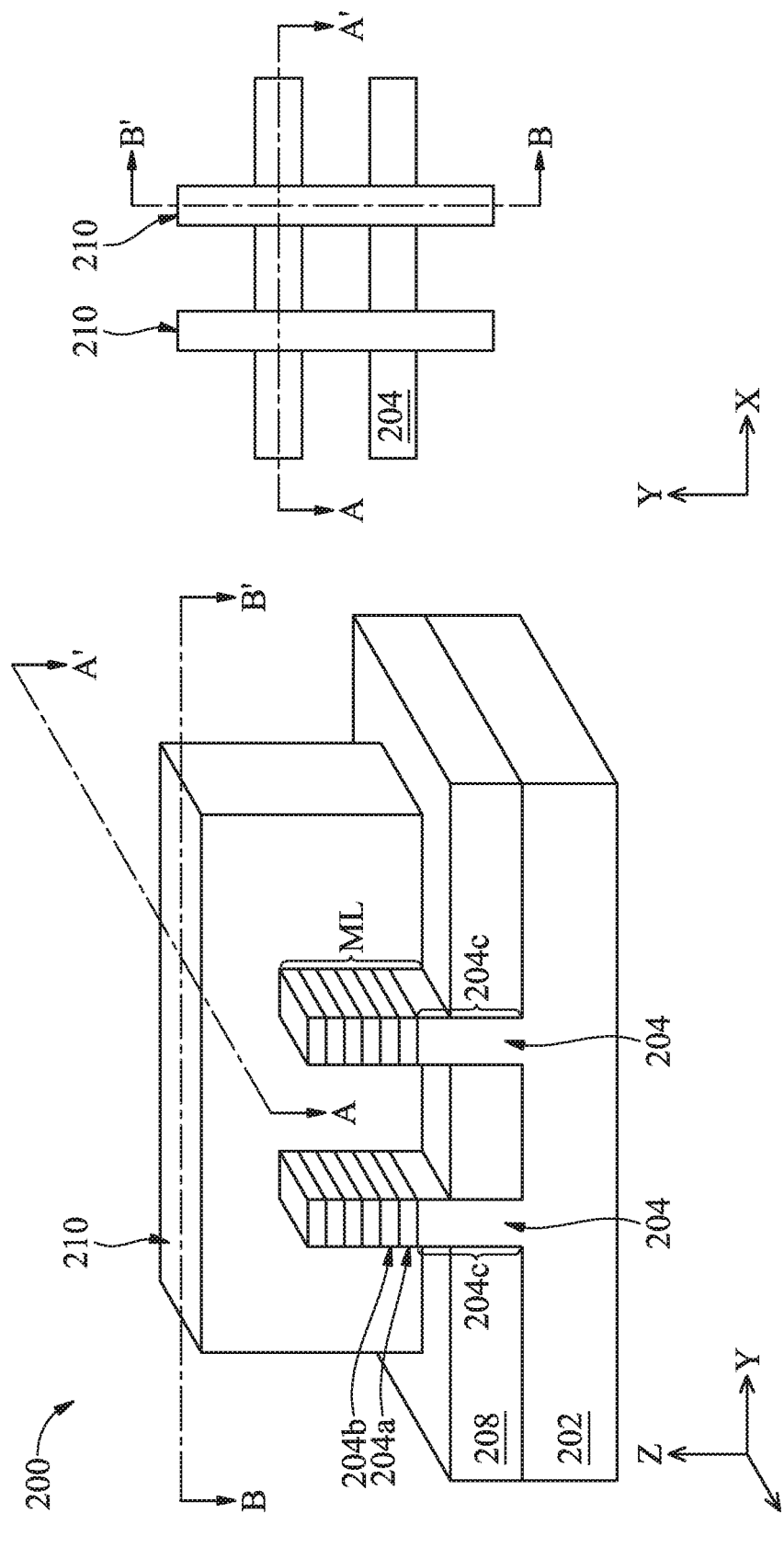
FIG. 2A is a three-dimensional perspective view of an example semiconductor device according to various embodiments of the present disclosure.
Figure 4:
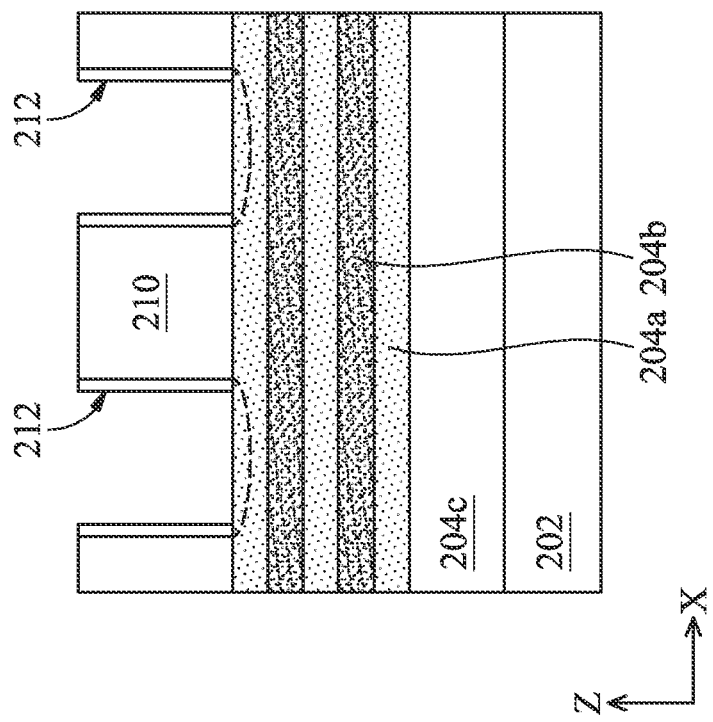

Still referring to FIGS. 2A, 2B, and 4, the dummy gate stack 210 is disposed over the fin 204 (and thus the ML) and may include polysilicon. In the present embodiments, portions of the dummy gate stack 210 are replaced with a HKMG after forming other components of the device 200. The dummy gate stack 210 may be formed by a series of deposition and patterning processes. For example, the dummy gate stack 210 may be formed by depositing a polysilicon layer over the fins 204 and performing an anisotropic etching process (e.g., a dry etching process) to remove portions of the polysilicon. In some embodiments, as depicted in FIG. 4, removing portions of the polysilicon layer may also remove a top portion of the ML, resulting in a curved upper surface as indicated by the dotted line. In some examples, forming the dummy gate stack 210 may further include forming an interfacial layer (not depicted) over the fin 204 before depositing the polysilicon layer.

Thereafter, still referring to FIG. 4, the top spacers 212 may be formed on the sidewalls of the dummy gate stack 210. The top spacers 212 may be a single-layer structure or a multi-layer structure and may include silicon oxide, silicon nitride, silicon carbide, silicon oxynitride, silicon oxycarbide, other suitable materials, or combinations thereof. The top spacers 212 may be formed by first depositing a dielectric layer over the dummy gate stack 210 and subsequently removing portions of the dielectric layer in an anisotropic etching process (e.g., a dry etching process), leaving portions of the dielectric layer on the sidewalls of the dummy gate stack 210 as the top spacers 212. The series of deposition and etching processes may be repeated to if a multi-layer structure is desired.

Subsequently, method 100 at operation 104 forms epitaxial S/D features (e.g., S/D features 230) in the S/D region of each fin 204, i.e., in at least a portion of the ML. In the present embodiments, operation 104 implements an embodiment of method 300 depicted in FIG. 1B to form the epitaxial S/D features. In the following disclosure, method 300 is discussed in detail with reference to FIGS. 5 to 16H.

Figure 5:
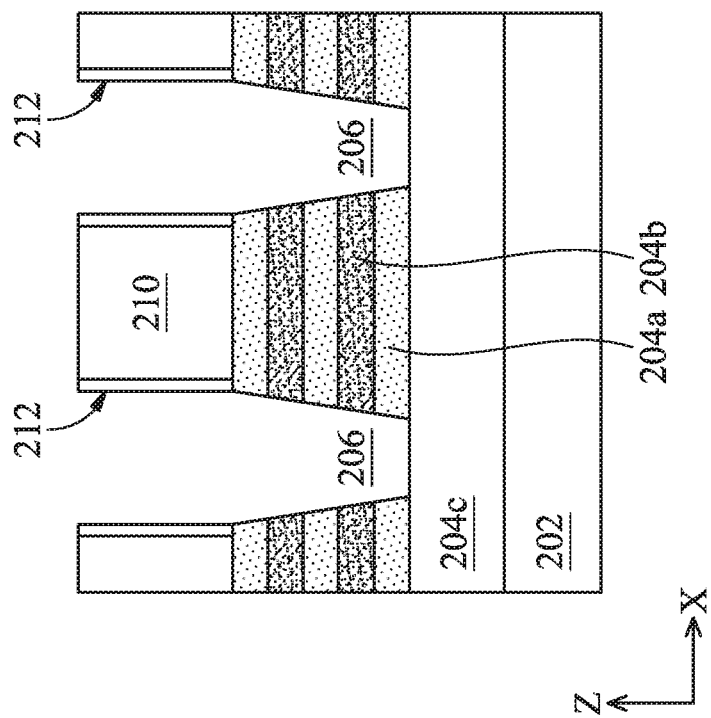

Referring to FIG. 5, method 300 at operation 302 remove portions of the ML to form an S/D recess 206. In some embodiments, the S/D recess 206 extends to below a top surface of the base fin 204c. In the present embodiments, one or more etching processes are performed to remove portions of the ML disposed between the dummy gate stacks 210. The etching process may include a dry etching process, a wet etching process, RIE, or combinations thereof. In some embodiments, method 300 implements a dry etching process using a suitable etchant or a combination of etchants. In some embodiments, the etching process at operation 302 may be tuned by adjusting duration, temperature, pressure, source power, bias voltage, bias power, etchant flow rate, and/or other suitable parameters. Depending upon the type of etching process employed, the S/D recess 206 may be defined by slanted sidewalls as depicted in FIG. 5 or, alternatively, by substantially vertical sidewalls. A cleaning process may subsequently be performed to clean the S/D recess 206 with a hydrofluoric acid (HF) solution or other suitable solution.

Figure 6:
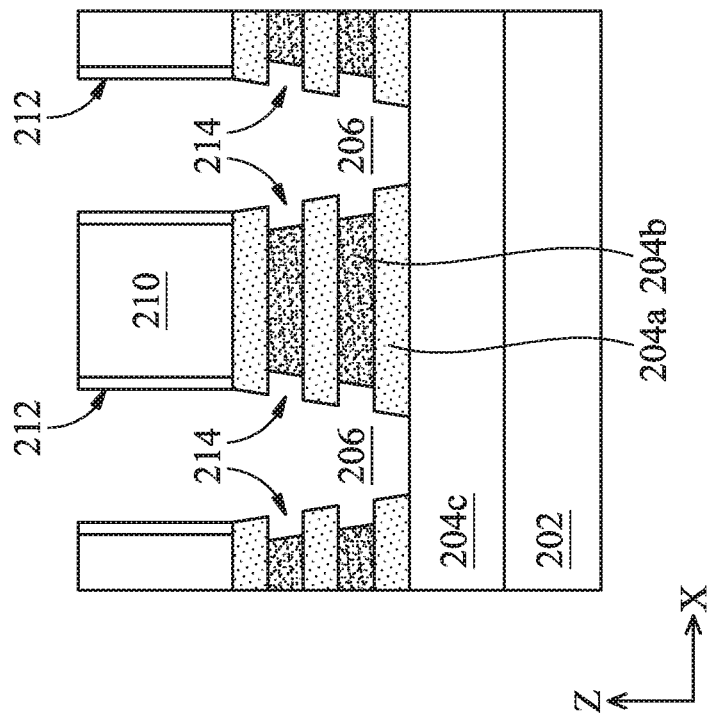

Referring to FIG. 6, method 300 at operation 304 removes portions of the non-channel layers 204b exposed in the S/D recess 206 to form recesses 214. In the present embodiments, method 300 selectively removes portions of the non-channel layers 204b without removing, or substantially removing, portions of the channel layers 204a exposed in the S/D recess 206. Method 300 forms the recesses 214 by performing a suitable etching process such as a dry etching process, a wet etching process, RIE, or combinations thereof. In the present embodiments, method 300 implements a dry etching process using a fluorine-based etchant, such as $CF_4$, $SF_6$, $CH_2F_2$, $CHF_3$, $C_2F_6$, other fluorine-containing etchants, or combinations thereof. In some embodiments, the etching process at operation 304 is controlled by factors such as duration, temperature, pressure, source power, bias voltage, bias power, etchant flow rate, and/or other suitable parameters to remove a desired amount of the non-channel layer 204b. In the present embodiments, an amount of the non-channel layers 204b removed at operation 304 is controlled by the duration of the etching process.

Subsequently, method 300 forms a dielectric layer 216 in the recesses 214. In the present embodiments, as will be discussed in detail below, the dielectric layer 216 constitutes a portion of inner spacers 222 (see FIG. 10) on the sidewalls of the non-channel layer 204b. At operation 306, method 300 deposits the dielectric layer 216 on the sidewalls of the S/D recess 206, i.e., over the exposed portions of the channel layers 204a and the non-channel layers 204b, thereby filling the recesses 214. The dielectric layer 216 may be deposited by any suitable method, such as ALD, CVD, PVD, other suitable methods, or combinations thereof. In the present embodiments, the dielectric layer 216 is deposited by an ALD process.

Figure 7:
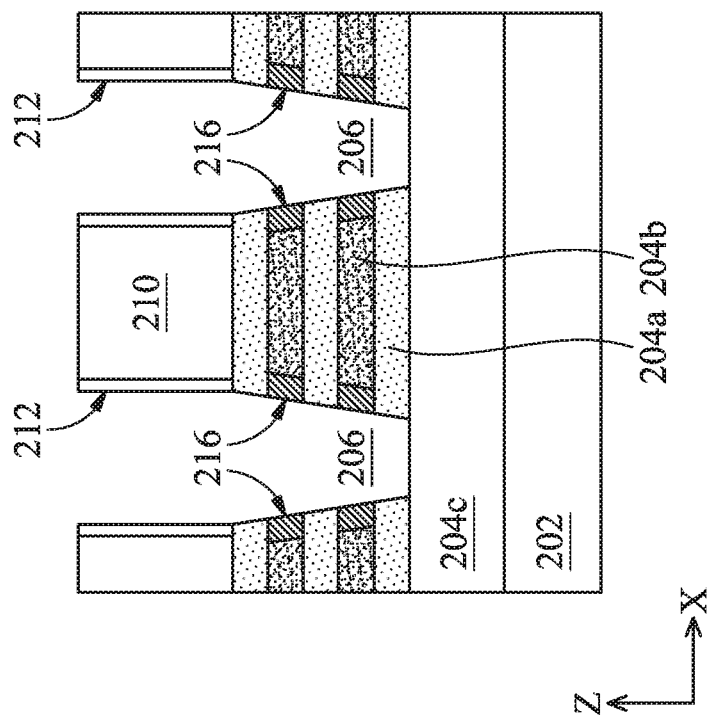

At operation 308, referring to FIG. 7, method 300 implements an etching process that removes portions of the dielectric layer 216 formed over the channel layers 204a. In some embodiments, sidewalls of the resulting dielectric layer 216 are substantially planar with the sidewalls of the channel layers 204a. In other words, the sidewalls of the dielectric layer 216 are substantially continuous with the sidewalls of the channel layers 204a. In some embodiments, the sidewalls of the resulting dielectric layer 216 curve inward and away from the sidewalls of the channel layers 204a. The etching process at operation 308 may be any suitable process, such as dry etching, wet etching, RIE, or combinations thereof. In the present embodiments, method 300 implements a dry etching process using an etchant that includes, for example, a chlorine-containing gas (e.g., $Cl_2$, $SiCl_4$, $BCl_3$, other chlorine-containing gases, or combinations thereof), a fluorine-containing gas (e.g., $CF_4$, $SF_6$, $CH_2F_2$, $CHF_3$, $C_2F_6$, other fluorine-containing etchants, or combinations thereof), a bromine-containing gas (e.g., HBr, other bromine-containing etchants, or combinations thereof), $O_2$, $N_2$, $H_2$, Ar, other suitable gases, or combinations thereof. The choice of etchant (or a combination of etchants) is not limited in the present embodiments and may depend upon the specific composition of the dielectric layer 216. In some embodiments, the etching process is stopped when the sidewalls of the channel layers 204a are exposed. In some embodiments, method 300 continues the etching process in a subsequent processing step, such that the dielectric layer 216 is further recessed (e.g., at operation 310 discussed in detail below with respect to FIG. 8).

In the present embodiments, the dielectric layer 216 include any suitable dielectric material such as silicon, oxygen, carbon, nitrogen, other suitable elements, or combinations thereof. For example, the dielectric layer 216 may include silicon oxide, silicon nitride, oxygen-doped silicon nitride, carbon-doped silicon nitride, silicon carbide, or combinations thereof. In some embodiments, the dielectric layer 216 include a high-k dielectric material having a dielectric constant greater than that of silicon oxide. In some embodiments, the dielectric layer 216 is substantially metal-free. In some examples, the dielectric layer 216 may include a dielectric material having a dielectric constant of about 3.5 to about 7.5. In some embodiments, composition of the dielectric layer 216 is chosen such that an etching selectivity is ensured between the dielectric layer 216, the channel layers 204a, and the non-channel layers 204b. In other words, when subjected to an etchant of choice, method 300 at operation 308 removes portions of the dielectric layer 216 without removing or substantially removing portions of the non-channel layers 204b or the channel layers 204a.

Referring to FIG. 1B, method 300 proceeds from operation 308 in one of two schemes, Scheme A or Scheme B. In the following discussion, Scheme A will be discussed with reference to FIGS. 8-10, 15A, and 16A-16D, and Scheme B will be discussed with reference to FIGS. 11-14, 15B, and 16E-16H. It is understood that the present disclosure does not require method 300 to proceed in any specific fashion, i.e., embodiments depicted in Scheme A and Scheme B are equally applicable. As discussed in detail below, Schemes A and B are directed to methods of forming inner spacers (e.g., the inner spacers 222 and 223) that include one or more dissimilar dielectric materials.

Figure 8:
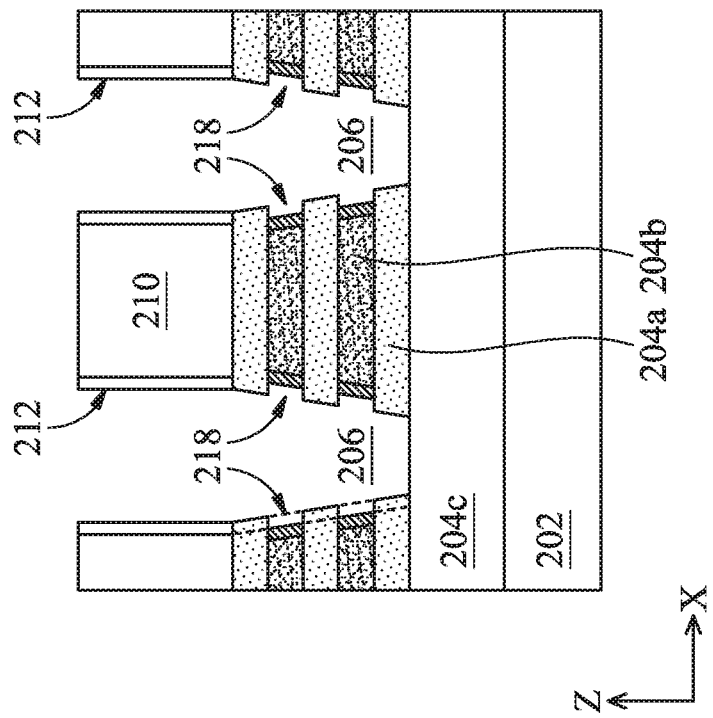

With respect to Scheme A, referring to FIG. 8, method 300 at operation 310 removes portions of the dielectric layer 216 to form recesses 218. In the present embodiments, method 300 implements a selective etching process to remove portions of the dielectric layer 216 without, or without substantially, removing portions of the channel layers 204a and/or the top spacers 212. In some embodiments, method 300 implements an etching process that is substantially similar to the etching process of operation 308 discussed above. After performing the etching process at operation 310, the sidewalls of the dielectric layer 216 are offset from the sidewalls of the channel layers 204a by a width of the recess 218, as indicated by the dotted lines in FIG. 8. As discussed above with respect to operation 308, the sidewalls of the dielectric layer 216 may be curved inward and away from the sidewalls of the channel layers 204a.

Subsequently, referring to FIG. 9, method 300 at operations 312 and 314 forms a dielectric layer 220 over the dielectric layer 216. At operation 312, in a deposition process similar to that of operation 306, method 300 forms the dielectric layer 220 on the dielectric layer 216 as well as on the sidewalls of the S/D recess 206 and the top spacers 212. The dielectric layer 220 may be deposited by any suitable method, such as ALD, CVD, PVD, other suitable methods, or combinations thereof. In the present embodiments, the dielectric layer 220 is deposited by an ALD process.

The dielectric layer 220 may include any suitable dielectric material having silicon, oxygen, carbon, nitrogen, phosphorous, boron, fluorine, other suitable elements, or combinations thereof. For example, the dielectric layer 220 may include silicon oxide, a low-k dielectric material, tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), other suitable dielectric materials, or combinations thereof. In the present embodiments, the dielectric layer 220 includes a dielectric material having a dielectric constant less than that of the dielectric layer 216. In an example embodiment, the dielectric layer 216 includes silicon nitride and the dielectric layer 220 includes silicon oxide. In another example embodiment, the dielectric layer 216 includes silicon nitride and the dielectric layer 220 includes carbon-doped silicon oxide. In some embodiments, the composition of the dielectric layer 220 is chosen such that an etching selectivity is ensured between the dielectric layer 220, the dielectric layer 216, the top spacers 212, and the channel layer 204a. In other words, when subjected to an etchant of choice, method 300 is configured to remove portions of the dielectric layer 220 without removing or substantially removing portions of the dielectric layer 216, top spacers 212, and the layer 204a.

Figure 9:
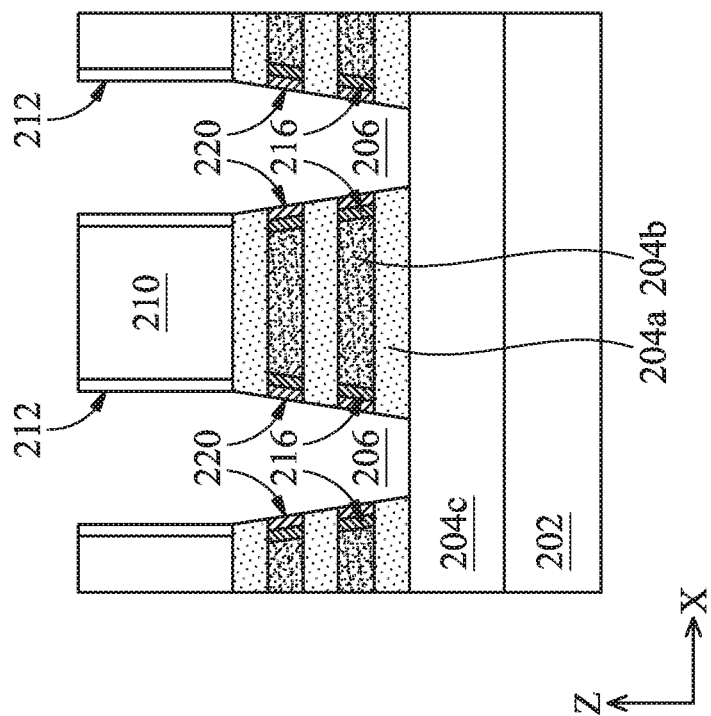

At operation 314, still referring to FIG. 9, method 300 implements an etching process that removes portions of the dielectric layer 220 formed over the channel layer 204a. In some embodiments, sidewalls of the resulting dielectric layer 220 are substantially planar with the sidewalls of the channel layers 204a. In other words, the sidewalls of the dielectric layer 220 are substantially continuous with the sidewalls of the channel layers 204a. In some embodiments, the sidewalls of the resulting dielectric layer 220 curve inward and away from the sidewalls of the channel layers 204a. The etching process at operation 314 may be similar to the etching process implemented at operation 308, such as a dry etching process, a wet etching process, RIE, or combinations thereof, although a different etchant may be used to tailor to the selective removal of the dielectric layer 220. In the present embodiments, method 300 implements a dry etching process using an etchant that includes, for example, a chlorine-containing gas (e.g., $Cl_2$, $SiCl_4$, $BCl_3$, other chlorine-containing gases, or combinations thereof), a fluorine-containing gas (e.g., $CF_4$, $SF_6$, $CH_2F_2$, $CHF_3$, $C_2F_6$, other fluorine-containing etchants, or combinations thereof), a bromine-containing gas (e.g., HBr, other bromine-containing etchants, or combinations thereof), $O_2$, $N_2$, $H_2$, Ar, other suitable gases, or combinations thereof. The choice of etchant (or a combination of etchants) is not limited in the present embodiments and may depend upon the specific composition of the dielectric layer 220. In some embodiments, the etching process is stopped when the sidewalls of the channel layers 204a are exposed.

Figure 10:
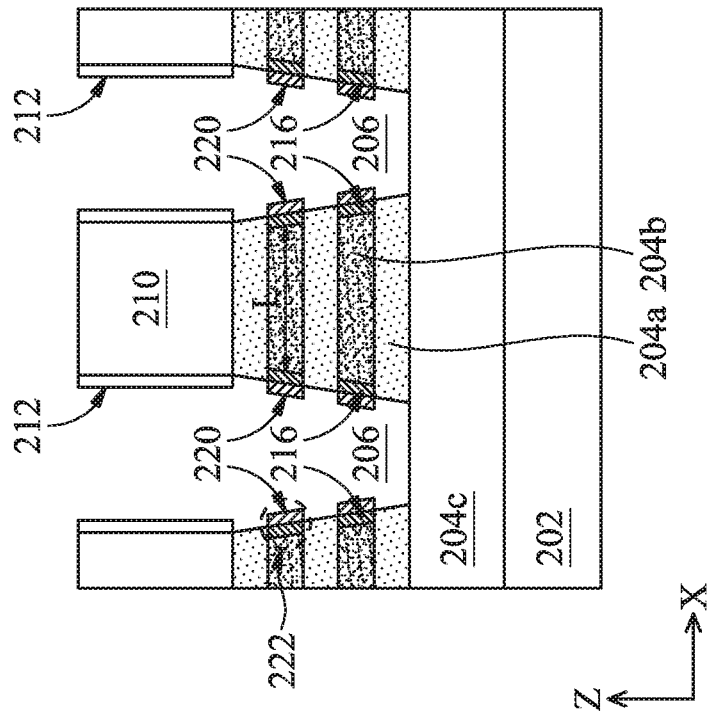

Subsequently, referring to FIG. 10, method 300 at operation 316 removes portions of the channel layers 204a, thereby completing formation of inner spacers 222. In the present embodiments, method 300 selectively removes portions of the channel layers 204a, which include a semiconductor material, without removing or substantially removing portions of the surrounding dielectric components (e.g., the dielectric layer 216, the dielectric layer 220, and/or the top spacers 212). The channel layers 204a may be etched by any suitable process, such as a dry etching process, a wet etching process, RIE, or combinations thereof. In the present embodiments, method 300 implements a dry etching process using any suitable etchant (or combination of etchants). For example, method 300 implements an etchant that includes HF. The extent of which the layers 204a is removed may be controlled by the duration of the etching process. In the present embodiments, recessing portions of the channel layers 204a enlarges the volume of the S/D features 230 subsequently formed in the S/D recess 206, thereby improving the performance of the device 200. As provided herein, the resulting inner spacers 222 as depicted in FIG. 10 has a dual-layer structure, i.e., including at least the dielectric layers 216 and 220.

In some examples, additional dielectric layers may be formed on the dielectric layer 220, such that the inner spacers 222 may include more than two dielectric layers. Each additional dielectric layer may have a composition similar to or different from those provided above with respect to the dielectric layers 216 and/or 220. Any additional dielectric layer(s) formed on the dielectric layer 220 is formed in a series of processes substantially similar to operations 310 to 316, and any additional dielectric layer may grow in a direction from one sidewall of the S/D recess 206 to an opposite sidewall of the S/D recess 206. In other words, the inner spacers 222 may grow in thickness without shortening an effective channel length L (i.e., the length of the non-channel layer 204b, which will be replaced by HKMGs, disposed between two channel layers 204a) as indicated in FIG. 10.

Figure 15A:
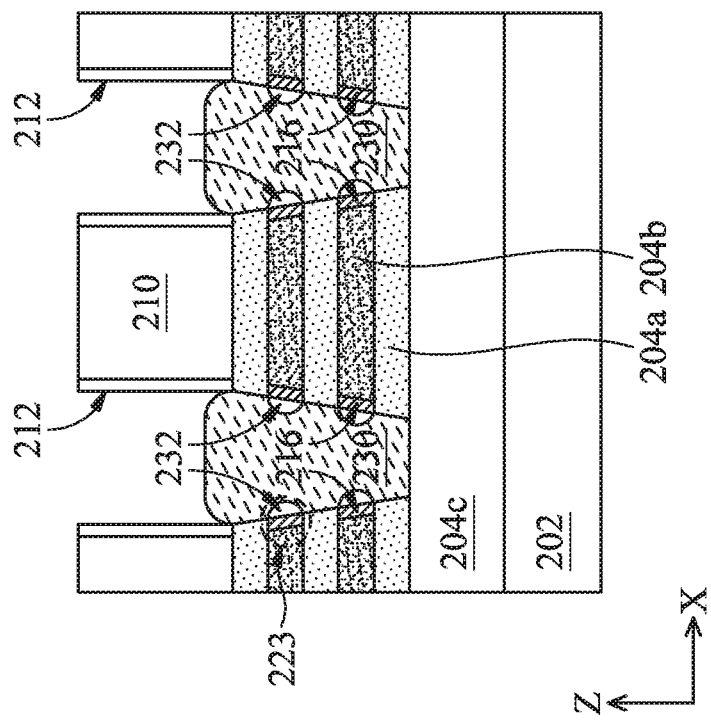

Thereafter, referring to FIG. 15A, method 300 at operation 320 forms the S/D features 230 in the S/D recess 206. In the depicted embodiment, the S/D features 230 substantially enclose or surround the inner spacers 222. In other words, the inner spacers 222 are fully embedded in the S/D features 230. The S/D features 230 may be formed by any suitable techniques. In some embodiments, one or more epitaxial growth processes are performed to grow an epitaxial material in the S/D recess 206. For example, method 300 may implement an epitaxial growth process as discussed above with respect to forming the ML.

Each of the S/D features 230 may be suitable for forming a p-type FinFET device (e.g., including a p-type epitaxial material) or alternatively, an n-type FinFET device (e.g., including an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopants. In some embodiments, the epitaxial material is doped in-situ by adding a dopant to a source material during the epitaxial growth process. In some embodiments, the epitaxial material is doped by an ion implantation process after performing a deposition process. In some embodiments, an annealing process is subsequently performed to activate the dopants in the S/D features 230.

Figure 16A:
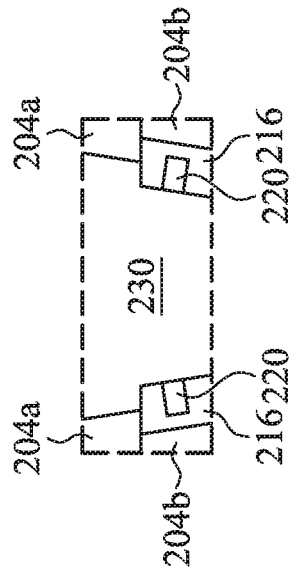
Figure 16B:
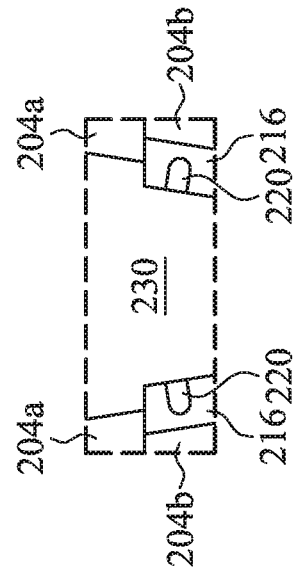
Figure 16C:
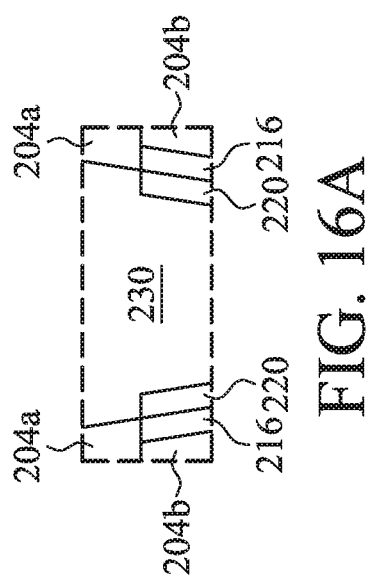
Figure 16D:
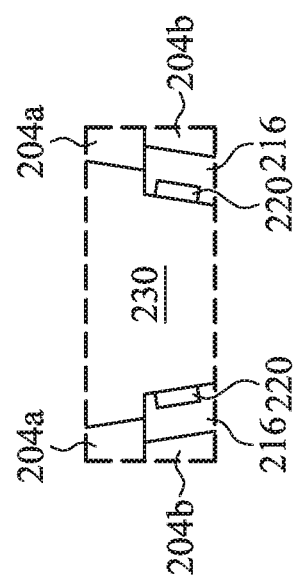
Figure 16E:
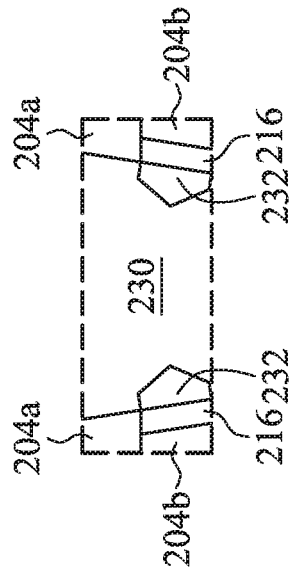
Figure 16F:
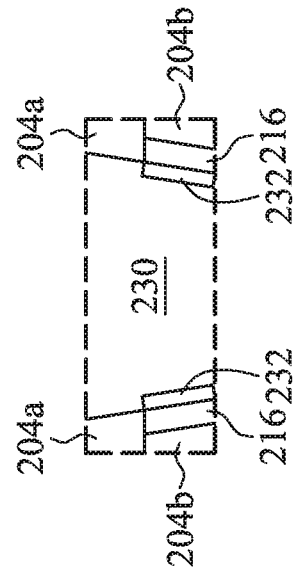
Figure 16G:
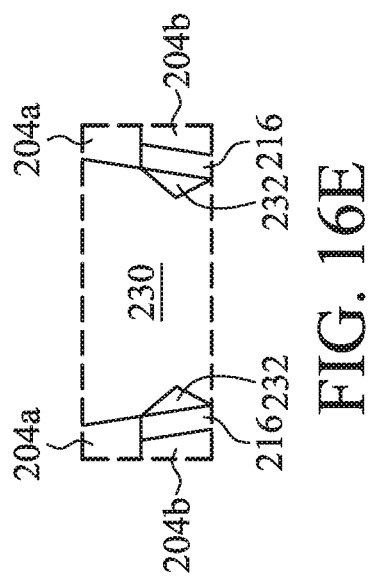
Figure 16H:
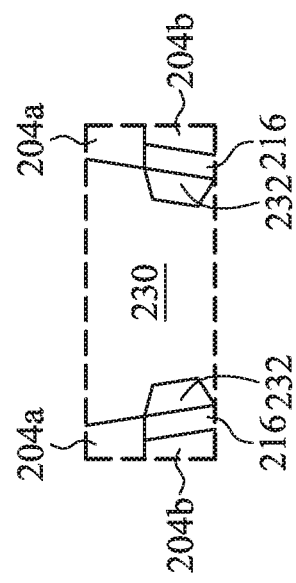

In some embodiments, referring to FIGS. 16A-16D, the inner spacers 222 may be configured to various geometries depending upon the etching process during which the dielectric layer 216 is recessed at operation 310. In some embodiments, method 300 may implement both isotropic and anisotropic etching processes, and the ratio of the extent of isotropic etching to the extent of anisotropic etching may be adjusted. In one example, such ratio is lower for the inner spacers 222 depicted in FIG. 16B than in FIG. 16A. In another example, such ratio is higher for the inner spacers 222 depicted in FIG. 16C than in FIG. 16B. In some embodiments, the ratio may be changed dynamically during the etching process to form different profiles. For example, the ratio may decrease at the end of the etching process in order to form rounded corners as depicted in FIG. 16D rather than sharp corners as depicted in FIG. 16B.

Figure 12:
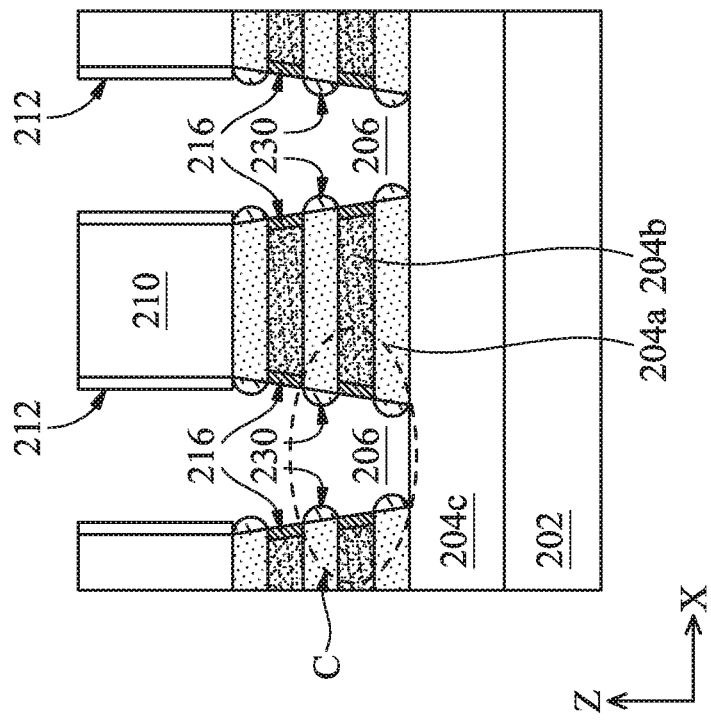
Figure 11:
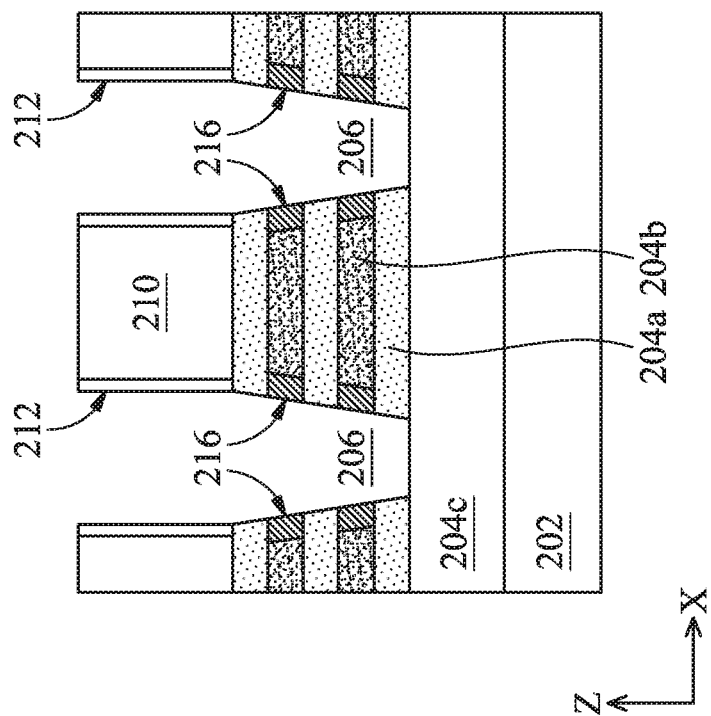
Figure 15B:
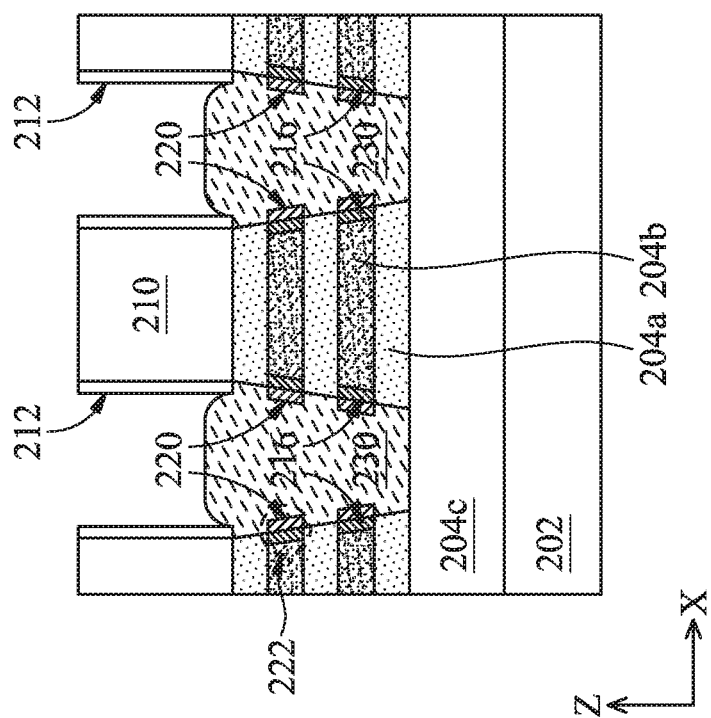

Turning to Scheme B depicted in FIG. 1B and referring to FIGS. 11, 12, and 15B, method 300 at operation 320 forms the S/D features 230 in the S/D recess 206 without forming the dielectric layer 220. In the present embodiments, method 300 may implement generally similar epitaxial growth processes as those discussed above with respect to operation 320 in the context of Scheme A. For example, method 300 may implement any suitable epitaxial growth process such as those discussed above with respect to forming the ML.

However, with respect to Scheme B, various conditions of the epitaxial growth process may be varied at operation 320 such that formation of the S/D features 230 leaves an air gap 232 (depicted in FIG. 15B) on an exposed surface of the dielectric layer 216. In other words, forming the S/D features 230 in the S/D recess 206 encloses the air gap 232 between the epitaxial material and the dielectric layer 216. As a result, the dielectric layer 216 and the air gap 232 may together be referred to as inner spacers 223.

Figures 13, 14:
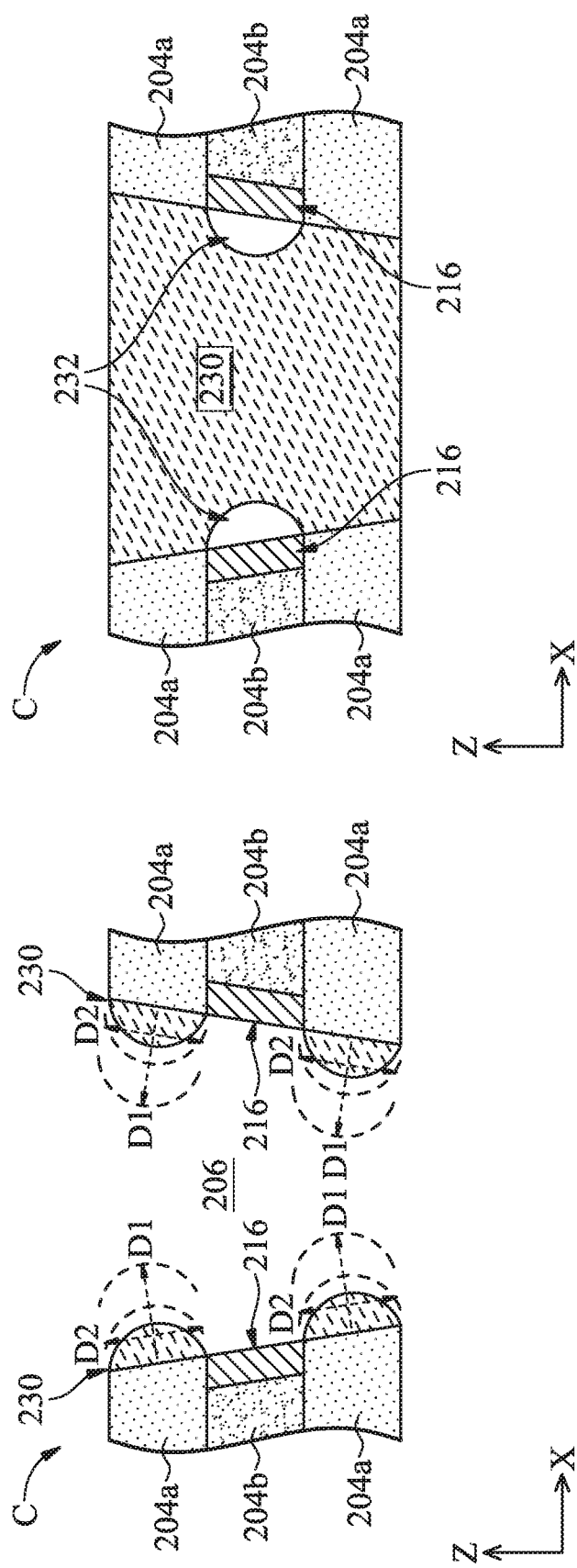

In the present embodiments, method 300 forms the air gap 232 by adjusting the growth rate of the epitaxial material in different directions with respect to the surface of the channel layers 204a exposed in the S/D recess 206. Notably, the growth of the epitaxial material selectively initiates on the channel layer 204a, which includes a semiconductor material, but not on the dielectric layer 216. Referring to FIG. 13, which is an enlarged depiction of portion C of the device 200 as labeled in FIG. 12, the present embodiments contemplate the effects of varying the growth rate of the epitaxial material in a direction substantially perpendicular to the sidewall of the S/D recess 206 (hereafter referred to as direction D1) with respect to the growth rate of the epitaxial material in a direction substantially parallel to the sidewall of the S/D recess 206 (hereafter referred to as a direction D2).

Still referring to FIG. 13, dotted arrows indicate the directions D1 and D2 and the dotted curves represent approximate growth fronts of the epitaxial material in the direction D1. In the present embodiments, various parameters of the epitaxial growth process are controlled such that the growth rate in the direction D1 is different from the growth rate in the direction D2. Referring to FIG. 14, such disparity between growth rates in different directions results in the air gap (or void) 232 forming over portions of the dielectric layer 216. In the present embodiments, the epitaxial growth process at operation 320 may be controlled by parameters including temperature, pressure, composition of a carrier gas, composition of the epitaxial material in the S/D features 230, orientation of the exposed surface of the channel layer 204a on which the epitaxial material grows, or combinations thereof.

In some embodiments, to increase the growth rate in the direction of D1 relative to the direction of D2, the deposition process may be implemented at reduced temperature, reduced pressure, and/or in the presence of an inert carrier gas (e.g., nitrogen), which are factors that may together or independently lower the surface migration rate of the epitaxial material.

In some embodiments, the growth rate in each of the directions D1 and D2 may be adjusted by controlling the amount of dopant in the epitaxial material. For an n-type epitaxial material, the amount of an n-type dopant may be adjusted with respect to the amount of silicon-carbon. For a p-type epitaxial material, the amount of a p-type dopant may be adjusted with respect to the amount of silicon-germanium.

Furthermore, in some embodiments, the growth rate in each of the directions D1 and D2 may be changed dynamically during the deposition process at operation 320 to form the air gap 232 with various geometric shapes as depicted in FIGS. 15B and 16E-16H. For example, referring to FIG. 15B, if the growth rate in the direction of D2 increases more rapidly than the growth rate in the direction of D1, then the resulting geometry of the air gap 232 may be rounded, such as in an approximately hemispherical shape. FIGS. 16E-16H depict approximate geometries of the air gap 232 if the growth rate in the direction of D1 increases more rapidly with respect to that in the direction of D2. In some embodiments, if the growth rate in the direction D1 slows down (while remaining greater than that in the direction of D2) before the epitaxial material bridges across the width of the S/D recess 206, the resulting geometry may have a generally pointed end (e.g., a triangular profile, such as those depicted in FIGS. 16E and 16F). In some embodiments, if the growth rate in the direction D1 speeds up before the epitaxial material bridges across the width of the S/D recess 206, the resulting geometry may have a blunt end (e.g., a rectangular profile, such as those depicted in FIGS. 16G and 16H). In the present embodiment, for example, the growth rate in the direction D1 speeds up more in the profile depicted in FIG. H than that depicted in FIG. G.

Figure 17B:
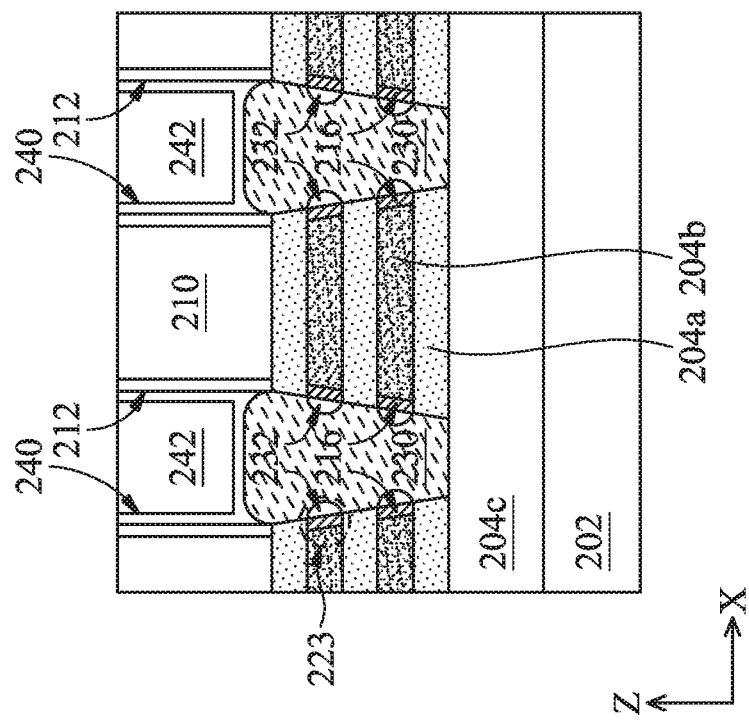
Figure 17A:
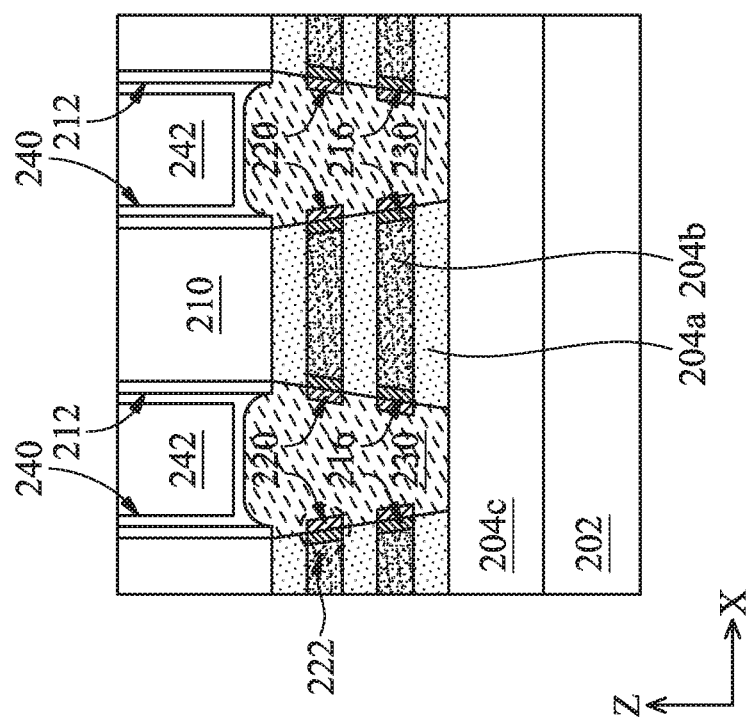
Figure 18B:
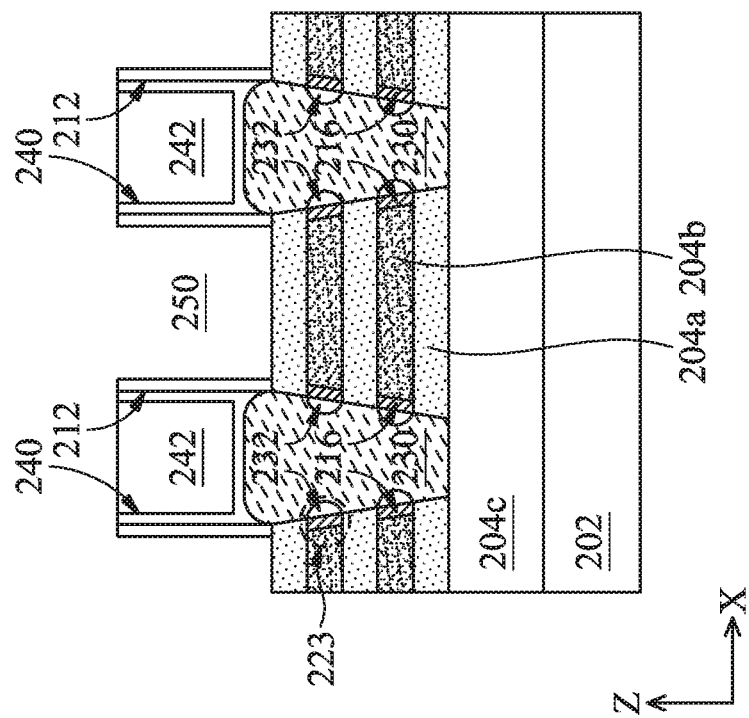
Figure 18A:
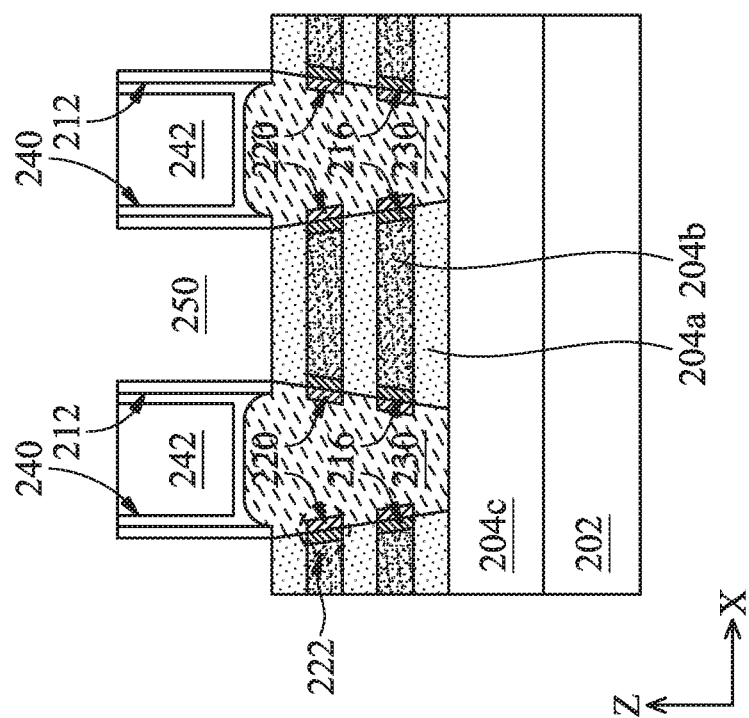

Referring to FIGS. 17A-18B, method 100 subsequently removes the dummy gate stacks 210 to form gate trenches 250 between the top spacers 212. Throughout the following disclosure, method 100 will be discussed in reference to embodiments that include the inner spacers 222 as depicted in FIGS. 17A, 18A, and 19A and the inner spacers 223 as depicted in FIGS. 17B, 18B, and 19B.

Referring to FIGS. 17A and 17B, method 100 at operation 106 forms an etch stop layer (ESL) 240 over the S/D features 230 and an interlayer dielectric (ILD) layer 242 over the ESL 240. The ESL 240 may include silicon nitride, silicon oxynitride, oxygen- or carbon-doped silicon nitride, other suitable materials, or combinations thereof, and may be formed by CVD, PVD, ALD, other suitable methods, or combinations thereof. The ILD layer 242 may include silicon oxide, a low-k dielectric material, TEOS, doped silicon oxide (e.g., BPSG, FSG, PSG, BSG, etc.), other suitable dielectric materials, or combinations thereof. Thereafter, method 100 may planarize the ILD layer 242 in one or more CMP processes to expose a top surface of the dummy gate stacks 210. Thereafter, referring to FIGS. 18A and 18B, at least portions of the dummy gate stacks 210 are removed from the device 200 to form the gate trenches 250 by any suitable etching process, such as a dry etching process.

Figure 19A:
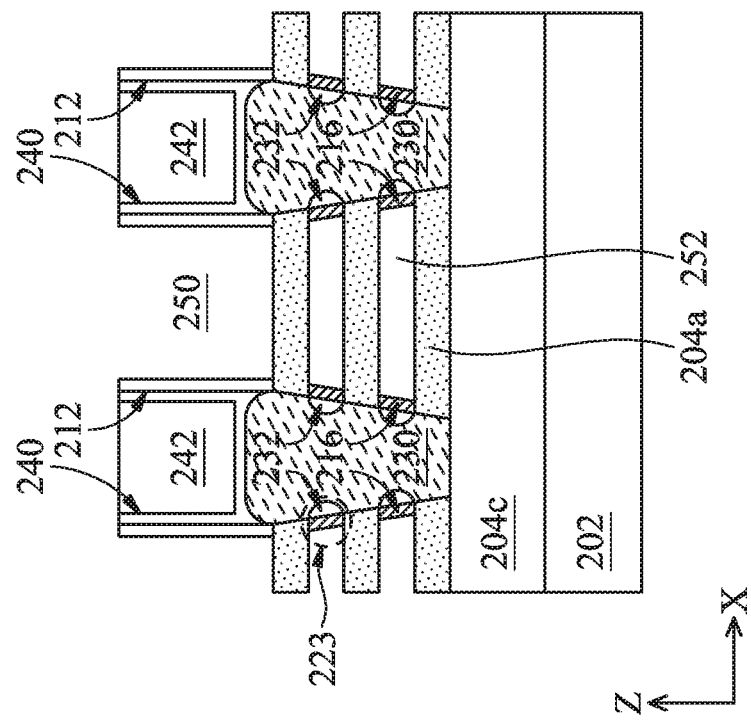
Figure 19B:
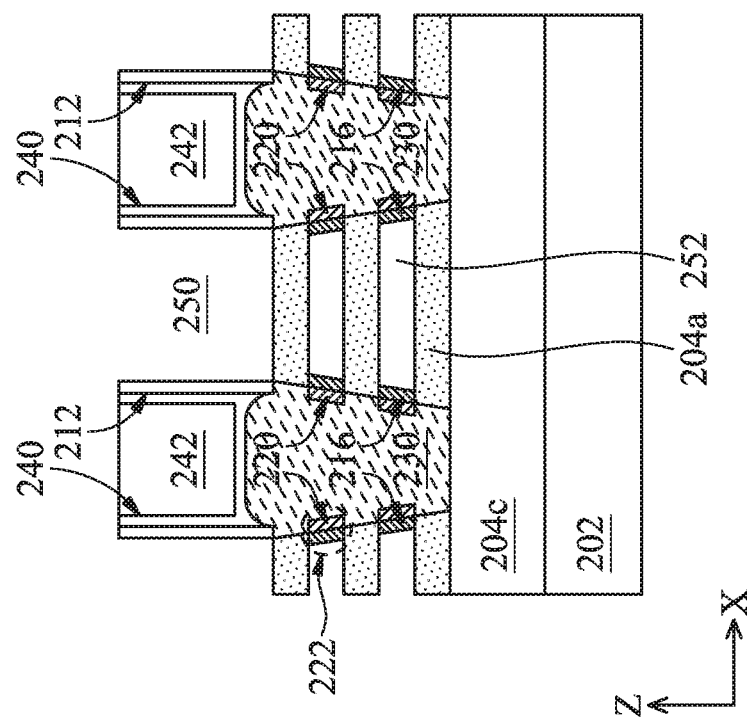

Referring to FIGS. 19A and 19B, method 100 at operation 108 then removes the non-channel layers 204b from the ML in the sheet (or wire) release process, thereby forming opening 252 between the channel layers 204a. In the present embodiments, method 100 selectively removes the non-channel layers 204b without removing, or substantially removing, the channel layers 204a. This may be accomplished by ensuring that sufficient etching selectivity exists between the non-channel layers 204b, the channel layers 204a, and the dielectric layer 216 (as a portion of the inner spacers 222 or 223). The non-channel layers 204b may be selectively removed by any suitable etching process, such as dry etching, wet etching, RIE, or combinations thereof. In one example, a wet etching process employing hydrogen peroxide ($H_2O_2$) may be performed to selectively remove the non-channel layers 204b that includes, for example, Ge. In another example, a dry etching process employing HF and/or another fluorine-based etchant may be implemented during the sheet release process to remove the non-channel layers 204b.

In some embodiments, referring to FIG. 19A, compositions of the dielectric layers 216 and 220 (that together form the inner spacers 222) are selected to accommodate the etching process of removing the non-channel layers 204b as well as to maintain a low capacitance for improved device performance. In the present embodiments, the dielectric layer 216, due to its proximity to the non-channel layers 204b (subsequently replaced by HKMGs 260), is configured to include a material having higher etching resistance than the dielectric layer 220, while the dielectric layer 220 is configured to include a material having a lower dielectric constant than the dielectric layer 216. In some embodiments, the dielectric layer 216 includes a material having a higher dielectric constant than the dielectric layer 220. For example, the dielectric layer 216 may include silicon nitride, oxygen-doped silicon nitride (SiON), carbon-doped silicon nitride (SiCN), other suitable dielectric materials, or combinations thereof, and the dielectric layer 220 may include silicon oxide, carbon-doped silicon oxide (SiOC), a low-k dielectric material, other suitable dielectric materials, or combinations thereof. In some embodiments, the dielectric layer 220 includes higher porosity (i.e., content of air) than the dielectric layer 216. In some embodiments, the top spacers 212 also differ from the dielectric layer 216 and/or the dielectric layer 220 with respect to its dielectric constant. In the present embodiments, the air gap 232 may be considered a low-k dielectric layer being disposed between the dielectric layer 216 and the S/D features 230.

Figure 20A:
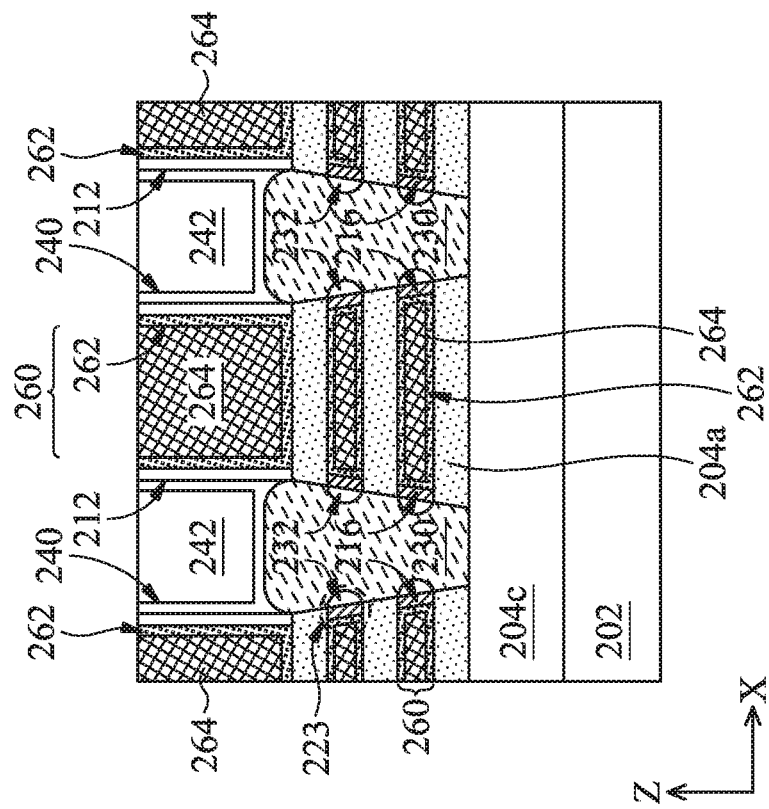
Figure 20B:
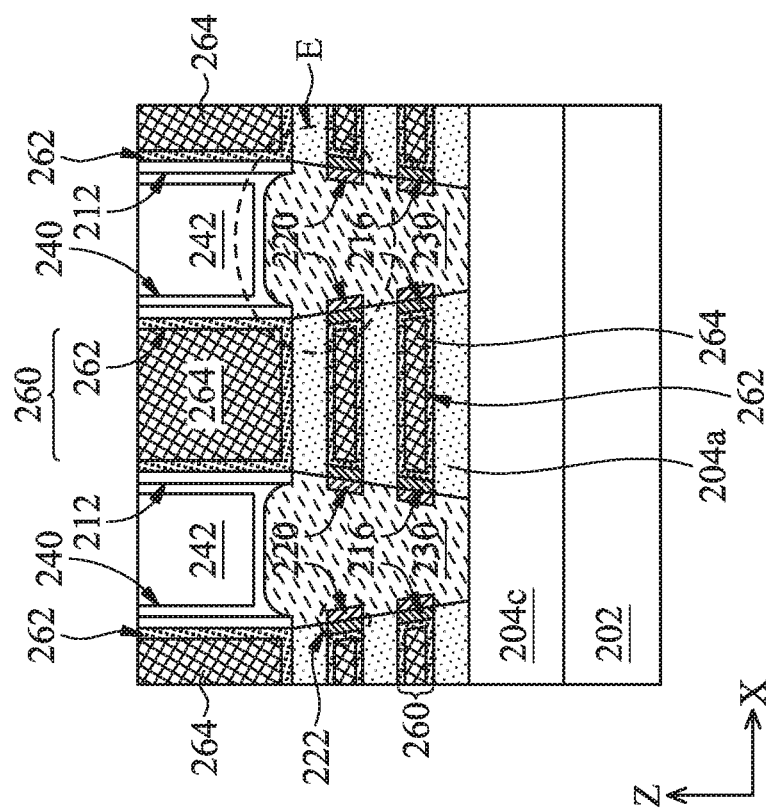

Now referring to FIGS. 20A and 20B, method 100 at operation 110 forms the HKMGs 260 in the gate trenches 250 and the openings 252. In other words, the HKMGs 260 are formed between the top spacers 212 as well as between the inner spacers 222 or 223. Each HKMG 260 includes at least a high-k dielectric layer 262 disposed in the gate trenches 250 and in the opening 252 and a metal gate electrode 264 disposed over the high-k dielectric layer 262. In the present embodiments, for each HKMG 260 formed in the gate trenches 250, sidewall portions of the high-k dielectric layer 262 are formed on the top spacers 212, while a bottom portion of the high-k dielectric layer 262 is formed on the topmost channel layer 204a, such that the high-k dielectric layer 262 is configured to be a U shape. For portions of the HKMGs 260 formed in the opening 252, sidewall portions of the high-k dielectric layer 262 are formed over the inner spacers 222 or 223 (e.g., the dielectric layer 216), while top and bottom portions of the high-k dielectric layer 262 are formed over the channel layers 204a, such that the high-k dielectric layer 262 is completely enclosed by the channel layers 204a and the inner spacers 222 or 223.

The high-k dielectric layer 262 may include any suitable high-k dielectric material, such as hafnium oxide, lanthanum oxide, other suitable materials, or combinations thereof. In some embodiments, the high-k dielectric layer 262 includes a dielectric material having a higher dielectric constant than the dielectric layer 216 and the dielectric layer 220. Though not depicted, the metal gate electrode 264 may further include at least one work function metal layer and a bulk conductive layer disposed thereover. The work function metal layer may be a p-type or an n-type work function metal layer. Example work function materials include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, other suitable work function materials, or combinations thereof. The bulk conductive layer may include Cu, W, Al, Co, Ru, other suitable materials, or combinations thereof. The HKMG 260 may further include numerous other layers (not depicted), such as an interfacial layer disposed between the channel layer 204a and the high-k dielectric layer 262, capping layers, barrier layers, other suitable layers, or combinations thereof. In some embodiments, the number of material layers included in each HKMG 260 is determined by the size of the opening 252 disposed between the channel layers 204a. Various layers of the HKMG 260 may be deposited by any suitable method, such as chemical oxidation, thermal oxidation, ALD, CVD, PVD, plating, other suitable methods, or combinations thereof.

Figure 21A:
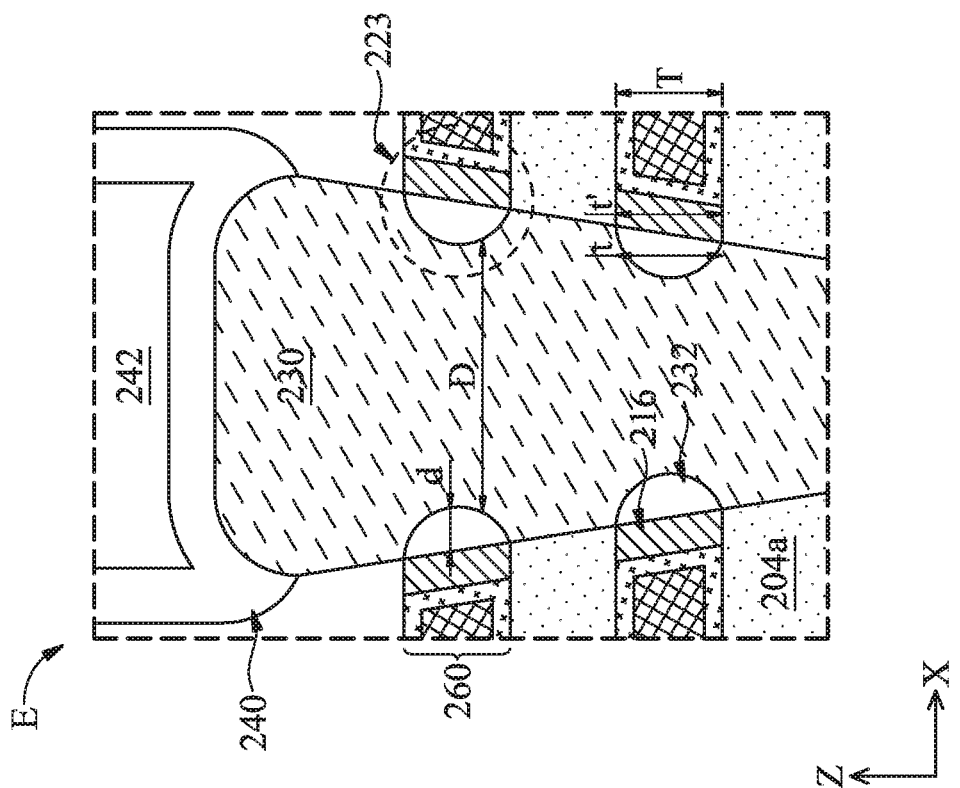
Figure 21B:
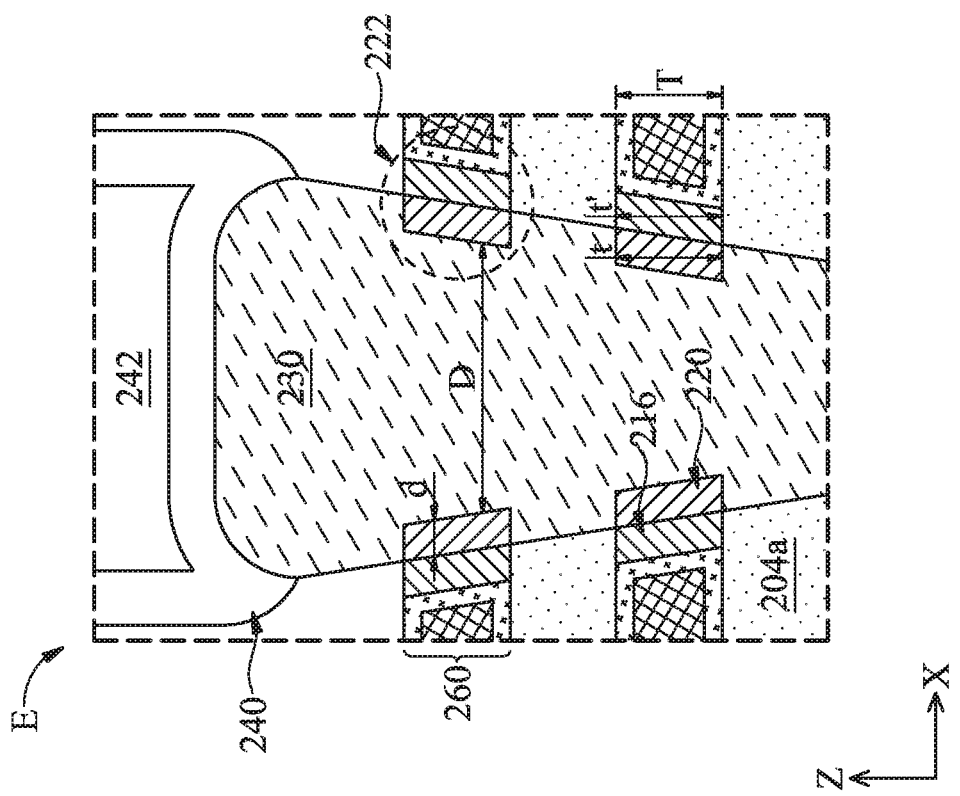

FIGS. 21A and 21B depict a portion E of the device 200 at an enlarged scale as shown in FIGS. 20A and 20B, respectively, detailing various dimensions of the features formed by method 100 as discussed above. Referring to FIG. 21A, a length d of the dielectric layer 220 measured along the lengthwise direction of the fin 204 (i.e., along the x axis) may be about 3% to about 15% of a length D of the S/D features 230 measured along the same direction. In some embodiments, if the length d is less than about 3% of the length D, then the dielectric layer 220 as a part of the inner spacers 222 would have negligible effect in reducing parasitic capacitance between the HKMGs 260 and the S/D features 230. In some embodiments, if the length d is more than about 15% of the length D, then the dielectric layer 220 would inadvertently reduce a size of the S/D features 230, thereby compromising the performance of the device 200. Furthermore, a thickness t of the dielectric layer 220 measured along a height of the S/D features 230 (i.e., along the z axis) may be about 80% to about 100% of (i.e., approximately the same as) a thickness T of the HKMGs 260 disposed between the channel layers 204a. In some embodiments, if the thickness t is less than about 80% of the thickness T, then portions of the dielectric layer 216 may be exposed to the S/D features 230, thereby curtailing the inner spacers 222's effect in reducing parasitic capacitance. In some embodiments, if the thickness t is greater than the thickness T, then the conductivity of the S/D features 230 may suffer, an effect similar to that discussed above with respect to the length d being too long. In some embodiments, a thickness t' of the dielectric layer 216 is greater than the thickness t and substantially similar to the thickness T of the HKMGs 260.

The present embodiments may implement inner spacers that include either a low-k dielectric layer as in the case of the dielectric layer 220 or air as in the case of the air gap 232 to reduce the overall parasitic capacitance between the S/D features 230 and the HKMGs 260. In this regard, the dielectric layer 220 and the air gap 232 have similar effect on the inner spacers' capacitance-reducing capability. Thus, the example dimensions and various effects discussed above with reference to the inner spacers 222 as depicted in FIG. 21A also apply to the inner spacers 223 as depicted in FIG. 21B. In this regard, the length d and the thickness t may be measured at the largest opening of the air gap 232 along the lengthwise direction of the fin 204 and the height of the S/D features 230, respectively. While depicted to be an approximately hemispherical in shape, the air gap 232 may be configured to any suitable geometries as discussed above.

Thereafter, referring to FIGS. 22A and 22B, method 100 at operation 112 performs additional processing steps to the device 200. For example, method 100 may form S/D contacts 270 over the S/D features 230. Each S/D contact may include any suitable conductive material, such as Co, W, Ru, Cu, Al, Ti, Ni, Au, Pt, Pd, other suitable conductive materials, or combinations thereof. Method 100 may form an S/D contact hole (or trench) in the ILD layer 242 via a series of patterning and etching processes and subsequently deposit a conductive material in the S/D contact hole using any suitable method, such as CVD, ALD, PVD, plating, other suitable processes, or combinations thereof. In some embodiments, a silicide layer (not depicted) is formed between the S/D features 230 and the S/D contact 270. The silicide layer may include nickel silicide, cobalt silicide, tungsten silicide, tantalum silicide, titanium silicide, platinum silicide, erbium silicide, palladium silicide, other suitable silicide, or combinations thereof. The silicide layer may be formed over the device 200 by a deposition process such as CVD, ALD, PVD, or combinations thereof. For example, a metal layer (e.g., titanium) may be deposited over the S/D features 230, and the device 200 is annealed to allow the metal layer and the semiconductor materials of the S/D features 230 to react. Thereafter, the un-reacted metal layer is removed, leaving the silicide layer over the S/D features 230. Subsequently, method 100 may form additional features over the device 200 such as, for example, gate contacts over the HKMGs 260, vertical interconnect features (e.g., vias), horizontal interconnect features (e.g., conductive lines), dielectric layers (e.g., intermetal dielectric layers), other suitable features, or combinations thereof.

Referring to FIGS. 23A and 23B, the device 200 may further include a fin 205 that comprises another ML of channel layers 205a disposed over a base fin 205c. In some embodiments, the fin 205 is disposed adjacent to the fin 204 over the substrate 202. In some embodiments, the fins 204 and 205 are configured to provide GAA FETs of opposite conductivity type. In one such example, the fin 204 may be doped with an n-type dopant, such as phosphorus, arsenic, and/or other n-type dopants, and the fin 205 may be doped with a p-type dopant, such as boron and/or other p-type dopants. Accordingly, the fin 204 may be configured to provide a p-type GAA FET and the fin 205 is configured to provide an n-type GAA FET. As depicted herein, the fins 204 and 205 may include MLs having different numbers of channel layers. For example, the ML of the fin 204 may include more channel layers than the fin 205 as depicted in FIG. 23A. Alternatively, the ML of the fin 205 may include more channel layers than the fin 204 as depicted in FIG. 23B.

Figure 24:
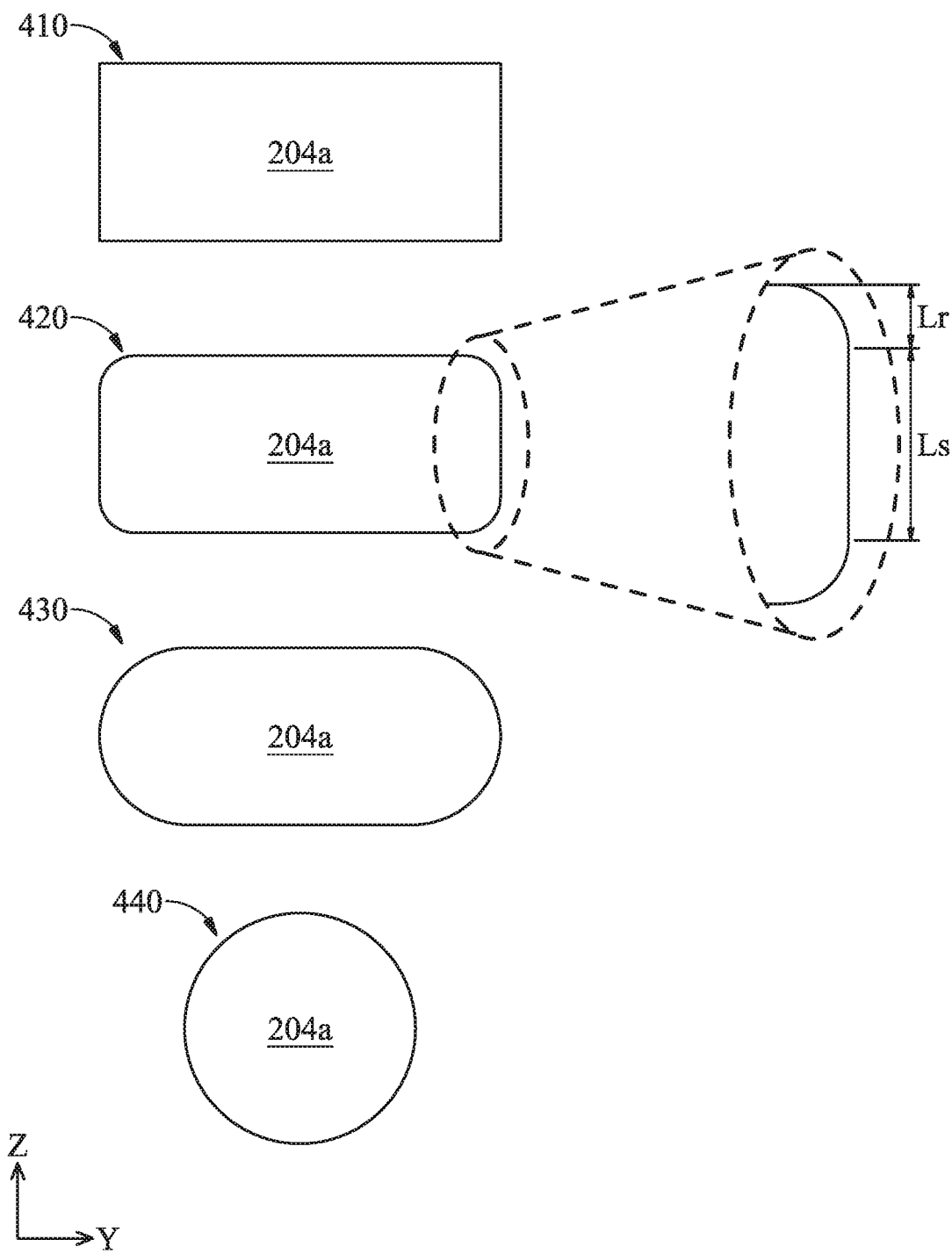

Furthermore, referring to FIG. 24, the cross-sectional view of the channel layers 204a depicted herein may be configured to various profiles. In one embodiment, the channel layers 204a may have a substantially rectangular cross-sectional profile 410. In another embodiment, the channel layers 204a may have a substantially rounded rectangular cross-sectional profile 420. In yet another embodiment, the channel layers 204a may have a substantially oblong cross-sectional profile 430. In one more embodiment, the channel layers 204a may have a substantially circular cross-sectional profile 440. Other suitable profiles may include squares (including rounded squares) or triangles (including rounded triangles). In embodiments where the profile is rounded (e.g., rounded rectangle or square, etc.), it is understood that a rounding ratio may be defined as Lr/Ls, where Lr represents the length of the rounded or curved segment, and Ls represents the straight segment. In some examples, the rounding ratio may be in a range between about 15:100 and about 1:1.

Although not intended to be limiting, one or more embodiments of the present disclosure provide many benefits to a semiconductor device and the formation thereof. For example, the present disclosure provides inner spacers (e.g., the inner spacers 222 and 223) in GAA devices having at least two dissimilar dielectric layers (e.g., the dielectric layer 216, the dielectric layer 220, and/or the air gap 232), one of which may be air. Some embodiments of the inner spacers include a first dielectric layer (e.g., the dielectric layer 216) disposed on portions of a metal gate stack (e.g., the HKMG 260) and a second dielectric layer (e.g., the dielectric layer 220 or the air gap 232) disposed over the first dielectric layer. The second dielectric layer may include a material having a lower dielectric constant than the first dielectric layer, and the first dielectric layer may include a material having a higher etching resistance than the second dielectric layer. In some embodiments, forming the two dielectric layers does not substantially shorten a channel length of the resulting GAA device. Accordingly, the inner spacers of the present embodiments are configured to lower parasitic capacitance between metal gate stack and S/D features, as well as to minimize damage to the inner spacers during the gate replacement processes. Embodiments of the disclosed methods can be readily integrated into existing processes and technologies for manufacturing three-dimensional FETs, such as GAA FETs and FinFETs.

In one aspect, the present embodiments provide a semiconductor structure that includes a stack of semiconductor layers disposed over a substrate, a stack of HKMGs interleaved between the stack of semiconductor layers, a dielectric inner spacer disposed on a sidewall of each HKMG, and an epitaxial S/D feature disposed adjacent to the stack of HKMGs. In the present embodiments, the dielectric inner spacer includes a first layer disposed on the sidewall of each HKMG and a second layer disposed on the first layer, where composition of the first layer is different from composition of the second layer, and where the second layer of the dielectric inner spacer is embedded in the epitaxial S/D feature.

In another aspect, the present embodiments provide a semiconductor structure that includes a plurality of channel layers disposed over a semiconductor substrate, a plurality of metal gate (MGs) each disposed between two channel layers, an inner spacer disposed on a sidewall of each MG, an S/D feature disposed adjacent to the plurality of MGs, and a low-k dielectric feature disposed on the inner spacer, where the low-k dielectric feature extends into the S/D feature.

In yet another aspect, the present embodiments provide a method the includes forming a structure having a dummy gate stack over a fin protruding from a semiconductor substrate, where the fin includes an ML of alternating semiconductor layers and sacrificial layers, forming a recess in an S/D region of the ML to expose sidewalls of the semiconductor layers and the sacrificial layers, forming inner spacers on the sidewalls of the sacrificial layers, where each inner spacer includes a first layer embedded in the sacrificial layer and a second layer disposed over the first layer, and forming an epitaxial s/D feature in the recess, such that the second layer of the inner spacers is embedded in the epitaxial S/D feature. In some embodiments, the second layer has a lower dielectric constant than the first layer. In the present embodiments, the method further includes removing the dummy gate stack to form a gate trench, removing the sacrificial layers from the ML after forming the epitaxial S/D feature, thereby forming openings interleaved between the semiconductor layers, and subsequently forming a high-k metal gate stack in the gate trench and the openings.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a stack of semiconductor layers disposed over a substrate;
    a high-k metal gate structure (HKMG) interleaved between the stack of semiconductor layers;
    a dielectric inner spacer disposed on a sidewall of the HKMG, wherein the dielectric inner spacer includes a first layer disposed on the sidewall of the HKMG and a second layer disposed on the first layer, and wherein composition of the first layer is different from composition of the second layer; and
    an epitaxial source/drain (S/D) feature disposed adjacent to the HKMG, wherein the second layer of the dielectric inner spacer is embedded in the epitaxial S/D feature, wherein the epitaxial S/D feature directly contacts a top surface, a bottom surface, and a sidewall of the first layer, and wherein the epitaxial S/D feature directly contacts a sidewall of the second layer.

2. The semiconductor structure of claim 1, wherein the first layer includes a first uniform composition of a first dielectric material having a first dielectric constant and the second layer includes a second uniform composition of a second dielectric material having a second dielectric constant, wherein the second dielectric constant is lower than the first dielectric constant, wherein the HKMG includes a gate dielectric layer surrounding a metal gate electrode, wherein the gate dielectric layer includes a third dielectric material having a third dielectric constant, and wherein the third dielectric constant is greater than the first dielectric constant.

3. The semiconductor structure of claim 2, wherein the third dielectric material is metal-containing, and wherein the first and the second dielectric materials are metal-free.

4. The semiconductor structure of claim 1, wherein the second layer includes air.

5. The semiconductor structure of claim 1, wherein a thickness of the second layer is less than a thickness of the HKMG.

6. The semiconductor structure of claim 1, wherein the HKMG includes a top portion disposed over the stack of semiconductor layers and a gate spacer disposed on a sidewall of the top portion of the HKMG, wherein composition of the gate spacer is different from composition of the second layer, and wherein an interface between the first layer and the second layer is distanced away from the gate spacer in a top view.

7. The semiconductor structure of claim 1, wherein the sidewall of the first layer and the sidewall of the second layer are coplanar.

8. A semiconductor device, comprising:
    a plurality of channel layers vertically stacked and disposed over a semiconductor substrate;
    a metal gate (MG) disposed between the channel layers;
    a first inner spacer disposed on a first sidewall of the MG;
    a source/drain (S/D) feature disposed adjacent to the MG; and
    a first low-k dielectric feature embedded in the first inner spacer, wherein the S/D feature is in direct contact with both the first inner spacer and the first low-k dielectric feature, wherein the first inner spacer protrudes into the S/D feature, and wherein the first inner spacer directly contacts both top and bottom surfaces of the first low-k dielectric feature.

9. The semiconductor device of claim 8, wherein composition of the first inner spacer is different from composition of the first low-k dielectric feature.

10. The semiconductor device of claim 9, wherein the first inner spacer includes a material having a first dielectric constant and the first low-k dielectric feature includes a material having a second dielectric constant, and wherein the second dielectric constant is less than the first dielectric constant.

11. The semiconductor device of claim 9, wherein the first low-k dielectric feature has higher porosity than the first inner spacer.

12. The semiconductor device of claim 8, further comprising:
    a second inner spacer disposed on a second sidewall of the MG above the first sidewall of the MG;
    a second low-k dielectric feature embedded in the second inner spacer, wherein the S/D feature is in direct contact with both the second inner spacer and the second low-k dielectric feature, and wherein the second inner spacer directly contacts both top and bottom surfaces of the second low-k dielectric feature;
    a top metal gate (top MG) disposed over the plurality of channel layers and extending continuously to the MG; and
    a gate spacer disposed on a sidewall of the top MG, wherein from a top view an interface between the first low-k dielectric feature and the S/D feature has a first distance from the gate spacer, an interface between the second low-k dielectric feature and the S/D feature has a second distance from the gate spacer, wherein the first distance is larger than the second distance, and wherein the MG includes a gate dielectric layer wrapping around each channel layer and a metal gate electrode disposed over the gate dielectric layer.

13. The semiconductor device of claim 8, wherein a length of the first low-k dielectric feature along a lengthwise direction of the plurality of channel layers is about 3% to about 15% of a length of the S/D feature.

14. A semiconductor structure, comprising:
    a stack of semiconductor layers disposed over a substrate;
    a gate structure interleaved with the stack of semiconductor layers;
    a first dielectric inner spacer disposed on a first sidewall of the gate structure, wherein the first dielectric inner spacer includes a first layer and a second layer disposed over the first layer, and wherein composition of the first layer is different from composition of the second layer; and
    an epitaxial source/drain (S/D) feature disposed adjacent to the gate structure, wherein the second layer of the first dielectric inner spacer protrudes into the epitaxial S/D feature, wherein the epitaxial S/D feature directly contacts both the first layer and the second layer, and wherein the first layer directly contacts both top and bottom surfaces of the second layer.

15. The semiconductor structure of claim 14, wherein the first layer includes a first dielectric material having a first dielectric constant and the second layer includes a second dielectric material having a second dielectric constant, and wherein the second dielectric constant is lower than the first dielectric constant.

16. The semiconductor structure of claim 15, wherein the gate structure includes a gate dielectric layer surrounding a metal gate electrode, wherein the gate dielectric layer includes a third dielectric material having a third dielectric constant, and wherein the third dielectric constant is greater than the first dielectric constant.

17. The semiconductor structure of claim 14, further comprising:

a second dielectric inner spacer disposed on a second sidewall of the gate structure above the first sidewall of the gate structure, wherein the second dielectric inner spacer includes a third layer and a fourth layer disposed over the third layer, wherein composition of the third layer is different from composition of the fourth layer, wherein the epitaxial S/D feature directly contacts both the third layer and the fourth layer, and wherein the third layer directly contacts both top and bottom surfaces of the fourth layer;

a top portion of the gate structure disposed over the stack of semiconductor layers; and a gate spacer disposed on a sidewall of the top portion, wherein from a top view an interface between the second layer and the epitaxial S/D feature has a first distance from the gate spacer, an interface between the fourth layer and the epitaxial S/D feature has a second distance from the gate spacer, and wherein the first distance is larger than the second distance, and wherein the second layer has higher porosity than the first layer.

18. The semiconductor structure of claim 14, wherein a length of the second layer along a lengthwise direction of the stack of semiconductor layers is about 3% to about 15% of a length of the epitaxial S/D feature.

19. The semiconductor structure of claim 14, wherein a thickness of the second layer is less than a thickness of a portion of the gate structure disposed between the semiconductor layers.

20. The semiconductor structure of claim 14, wherein a thickness of the second layer is at least about 80% of a thickness of a portion of the gate structure between two semiconductor layers.

* * * * *